(12) United States Patent
Ito

(10) Patent No.: US 7,420,283 B2
(45) Date of Patent: Sep. 2, 2008

(54) INTEGRATION TYPE SEMICONDUCTOR DEVICE AND METHOD FOR MANUFACTURING THE SAME

(75) Inventor: Hiroyasu Ito, Nagoya (JP)

(73) Assignee: DENSO CORPORATION, Kariya (JP)

( * ) Notice: Subject to any disclaimer, the term of this patent is extended or adjusted under 35 U.S.C. 154(b) by 238 days.

(21) Appl. No.: 11/270,458

(22) Filed: Nov. 10, 2005

(65) Prior Publication Data

US 2006/0097407 A1 May 11, 2006

(30) Foreign Application Priority Data

Nov. 11, 2004 (JP) ............... 2004-328124
Oct. 12, 2005 (JP) ............... 2005-298076

(51) Int. Cl.
*H01L 21/44* (2006.01)
*H01L 29/76* (2006.01)
*H01L 31/062* (2006.01)
*H01L 23/48* (2006.01)

(52) U.S. Cl. ............... 257/779; 257/780; 257/784; 257/E23.02

(58) Field of Classification Search ............... 257/779, 257/780, 784, E23.02
See application file for complete search history.

(56) References Cited

U.S. PATENT DOCUMENTS

| 5,149,674 | A | 9/1992 | Freeman, Jr. et al. | |
|---|---|---|---|---|
| 5,287,002 | A | 2/1994 | Freeman, Jr. et al. | |
| 6,229,221 | B1 | 5/2001 | Kloen et al. | |
| 6,803,302 | B2 | 10/2004 | Pozder et al. | |
| 6,909,191 | B2 * | 6/2005 | Hatano et al. | 257/761 |
| 2001/0051426 | A1 * | 12/2001 | Pozder et al. | 438/666 |
| 2003/0011073 | A1 * | 1/2003 | Shinogi et al. | 257/758 |
| 2005/0014356 | A1 | 1/2005 | Pozder et al. | |
| 2005/0121803 | A1 * | 6/2005 | Angell et al. | 257/779 |
| 2006/0097406 | A1 * | 5/2006 | Wu et al. | 257/784 |

FOREIGN PATENT DOCUMENTS

| EP | 0 587 442 | 3/1994 |
|---|---|---|
| JP | A-63-161634 | 7/1988 |

OTHER PUBLICATIONS

U.S. Appl. No. 11/132,282, filed May 19, 2005, Itou.

* cited by examiner

*Primary Examiner*—Phat X Cao
(74) *Attorney, Agent, or Firm*—Posz Law Group, PLC

(57) ABSTRACT

A semiconductor device includes: a plurality of power MOS cells on a semiconductor substrate; a plurality of lead wires connecting to a source and a drain of each power MOS cell through a contact hole; a plurality of collecting electrodes connecting in parallel with the lead wires through a via hole; an interlayer protection film on the collecting electrode; a thick film electrode connecting to the collecting electrode through the opening; and a terminal protection film having an opening for bonding connection. The openings are formed in the interlayer protection film such that a portion between the openings becomes a beam shape

9 Claims, 20 Drawing Sheets

5k  5h 5k  5h

| MATERIAL | ELASTIC MODULUS :E [dyn/cm²] | SPECIFIC RESISTANCE :ρ [Ωcm] |
|---|---|---|
| Ti | $1.1 \times 10^{-12}$ | $1.3 \times 10^{-5}$ |
| Cr | $2.5 \times 10^{-12}$ | $1.3 \times 10^{-5}$ |
| Ni | $2.1 \times 10^{-12}$ | $6.8 \times 10^{-5}$ |
| W | $3.9 \times 10^{-12}$ | $5.5 \times 10^{-5}$ |
| Au | $8.8 \times 10^{-13}$ | $2.3 \times 10^{-6}$ |
| Cu | $1.4 \times 10^{-12}$ | $1.8 \times 10^{-6}$ |
| Al | $7.6 \times 10^{-13}$ | $3.0 \times 10^{-6}$ |

INTEGRATION TYPE SEMICONDUCTOR DEVICE AND METHOD FOR MANUFACTURING THE SAME

CROSS REFERENCE TO RELATED APPLICATIONS

This application is based on Japanese Patent Applications No. 2004-328124 filed on Nov. 11, 2004, and No. 2005-298076 filed on October 12, the disclosures of which are incorporated herein by reference.

FIELD OF THE INVENTION

The present invention relates to an integration type semiconductor device and method for manufacturing the same.

BACKGROUND OF THE INVENTION

Conventionally, deformation or breakdown of a pad electrode or breakdown and the like of a region under the pad electrode becomes a problem. They are caused by bonding impact such as pressurization or supersonic vibration of a bonding connection, when an aluminum wire or a gold wire is bonded and connected to the pad electrode as an external output electrode of the semiconductor device.

To improve failure of the pad electrode attributed to the bonding impact, as shown in FIG. 15, a first prior art (i.e., Japanese Laid-Open Patent Publication No. S63-161634) discloses a construction for absorbing the bonding impact by forming a planar shape of a pad electrode 71 to be a network construction in such a manner that a through hole 74$k$ is formed in the pad electrode 71 made of aluminum or aluminum alloy.

However, when a size of the pad electrode is the same, a problem occurs that connection strength of a bonding portion becomes smaller. This is because a wire is not mechanically connected to a field oxide film exposed on a bottom of the through hole in this construction. The wire is embedded in the through hole 74$k$ when the bonding connection is performed.

Further, in the manufacturing process of the semiconductor device, there is a problem that the network construction of the pad electrode 71 formed by the through hole 74$k$ is broken down when a needle is placed (i.e., a probe operation is performed) in a test process performed before the bonding connection.

Furthermore, a second prior art (i.e., Japanese Laid-Open Patent Publication No. 2001-156070, which corresponds to US Patent Application Publication No. 2005/0014356-A1) shown in FIG. 16 is proposed as another prior art for improving failure of the pad electrode attributed to the bonding impact. According to the second prior art, a support construction 83$s$ is formed by opening a part of a terminal insulation protection film 83. The film 83 is formed of dielectric material on a pad electrode 82, which is made of electric conductive material such as aluminum. The bonding impact is absorbed by bonding the pad electrode 82 through the support construction 83$s$.

However, in this construction, the pad electrode 82 is bonded and connected through the support construction 83$s$. Therefore, there is a problem that connection strength of a bonding portion is reduced, similar to the first prior art. Further, since a needle is placed on the pad electrode 82 through the support construction 83$s$ in case of the probe operation, a problem occurs that failure of electric connection between the pad electrode 82 and the needle is caused.

As described above, in addition to the problem that failure of the pad electrode is caused by the bonding impact, in the prior art for absorbing and reducing the bonding impact, there are other problems such as reduction of the connection strength of the bonding portion, breakdown of the pad electrode construction in case of the probe operation, and failure of electric connection.

SUMMARY OF THE INVENTION

In view of the above-described problem, it is an object of the present invention to provide an integration type semiconductor device. It is another object of the present invention to provide a method for manufacturing an integration type semiconductor device.

The present invention provides a construction as follows. An impact-absorbing beam is formed in such a manner that a part of an interlayer protection film is opened. The interlayer protection film is formed on a pad of an integrate circuit or a collecting electrode of a power element. A thick film electrode is formed on the collecting electrode of the power element so that the impact-absorbing beam is packed with the collecting electrode and the thick film electrode. The thick film electrode is connected to the collecting electrode through an opening of the interlayer protection film. A thickness of the thick film electrode is determined so that a bottom of a surface concavity is disposed on the upper side of a surface of the impact-absorbing beam. Thus, the bonding impact is reduced and absorbed by the thick film electrode and the impact-absorbing beam when a bonding connection to the thick film electrode is performed.

In another semiconductor device according to the present invention, an impact-absorbing beam is formed by opening a part of an interlayer protection film formed on a pad of an integrate circuit or a collecting electrode of a power element. A thick film electrode is made of a material having mechanical strength higher than that of the collecting electrode. The thick film electrode is connected to the collecting electrode through the opening of the interlayer protection film. The thick film electrode is covered with a material having mechanical strength lower than that of the thick film electrode. The thickness of the thick film electrode is determined in such a manner that a bottom of a surface concavity of the thick film electrode is disposed on the upper side of the surface of the impact-absorbing beam. Thus, the bonding impact is reduced and absorbed by the coating layer of the thick film electrode, the thick film electrode and the impact-absorbing beam when a bonding connection to the thick film electrode is performed.

In further another semiconductor device according to the present invention, an interlayer protection film formed on a pad of an integrate circuit or a collecting electrode of a power element has a multi-layered structure composed of different dielectric materials. Therefore, adhesiveness between the interlayer protection film and the collecting electrode is improved, and mechanical strength of an impact-absorbing beam is improved by the interlayer protection film. In addition, adhesiveness between the protection film and the thick film electrode is improved. Further, the impact-absorbing beam is formed by opening a part of the interlayer protection film in such a manner that an edge of the opening of the interlayer protection film becomes a tapered shape. The thick film electrode is formed under a deposition condition of high step coverage so that a bottom of a surface concavity is disposed on an upper side of a surface of the impact-absorbing beam. The thick film electrode is connected to the collecting electrode through the opening of the interlayer protection film. Thus, a vertical component of a bonding impact perpendicular to the semiconductor substrate is reduced when the bonding connection to the thick film electrode is performed. Further, a horizontal component of the bonding impact is also reduced and absorbed by the impact-absorbing beam, mechanical strength of which is increased.

In the semiconductor device having the above construction according to the present invention, the bonding impact is prevented from transmitting to the power element portion disposed under the collecting electrode, so that failure of the bonding connection is prevented from occurring.

Further, in each construction, the thick film electrode has a construction, in which the thick film electrode is covered with a terminal protection film having an opening for bonding connection. Therefore, the problem regarding adhesiveness in case of the probe operation does not occur. Further, deterioration of bonding strength does not occur. This is because the bonding wire and the surface of the thick film electrode are directly bonded when the bonding connection is performed.

In addition, in each construction, the impact-absorbing beam is packed with the thick film electrode and the collecting electrode. Therefore, even when the impact-absorbing beam is broken down in a case where the bonding impact is reduced and absorbed, failure such as short-circuit between electrodes does not occur, the failure which may occur at the power element portion disposed under the collecting electrode, and be caused by the breakdown of the impact-absorbing beam. This is because the thick film electrode and the collecting electrode are initially and electrically connected together.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
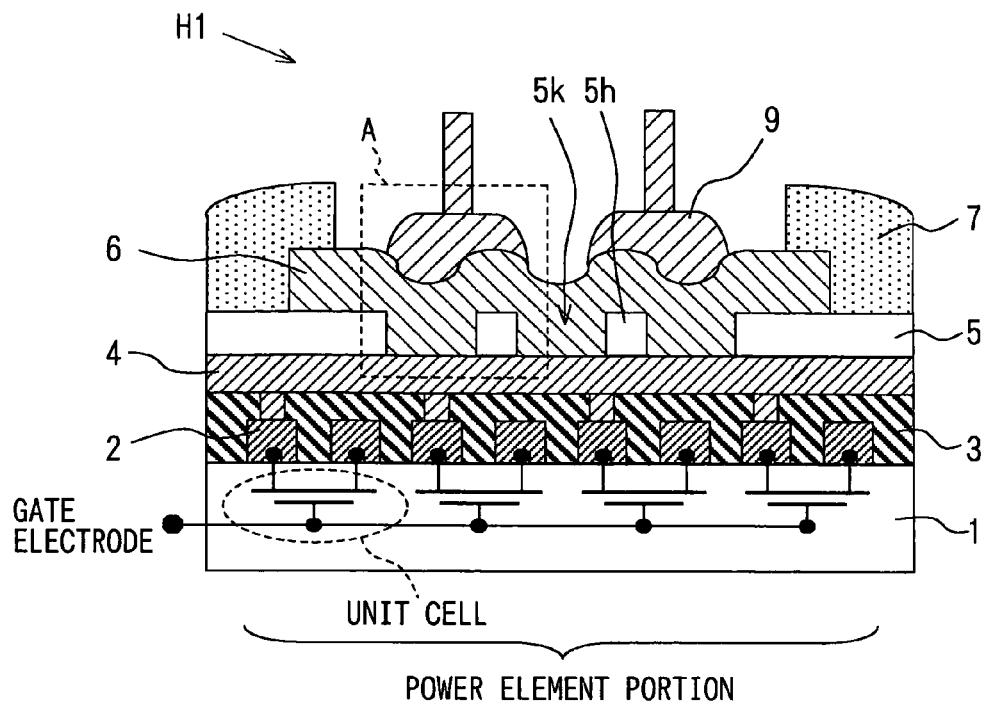
FIG. 1A is a schematic cross sectional view showing a semiconductor device according to a first embodiment.
Figure 1B:
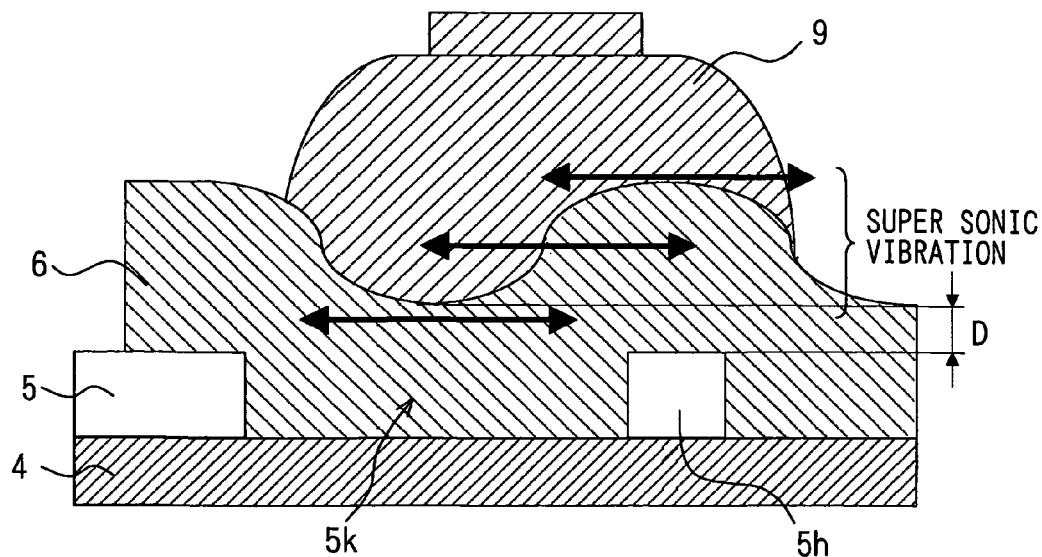
FIG. 1B is a partially enlarged view showing an A-part surrounded with a broken line in FIG. 1A and explaining function and effect.

FIG. 1A is a schematic view showing a semiconductor device H1 according to a first embodiment of the present invention. Further, FIG. 1B is a partially enlarged view showing an A-part surrounded with a broken line in FIG. 1A, and the view explaining function of the first embodiment.

The semiconductor device H1 includes multiple power element unit cells such as a LDMOS (i.e., a Lateral Diffused MOS) unit cells formed in a silicon substrate 1. In the cells, gates, sources and drains are independently retrieved and connected in parallel. As shown in FIG. 1(a), a lead wire 2 is formed to connect to the source or the drain in each unit cell through a contact hole. The lead wire 2 connected to the source or the drain is connected to a collecting electrode 4 through a via hole formed in the interlayer insulation layer 3. The collecting electrode 4 is connected to the source or the drain in parallel. FIG. 1(a) schematically shows the collecting electrode 4 for connecting the lead wires 2 of either source or drain in parallel.

An interlayer protection film 5 is formed on the collecting electrode 4. Multiple openings 5k are adjacently disposed in the interlayer protection film 5. An impact absorbing beam 5h is formed of the interlayer protection film 5 between the neighboring openings 5k. A thick film electrode 6 is formed on the interlayer protection film 5. The thick film electrode 6 is made of the same material as the collecting electrode 4, and connected to the collecting electrode 4 through multiple openings 5k. Further, a terminal protection film 7 for covering the electrode 6 is formed on a top surface of the silicon substrate 1. A part of the terminal protection film 7 is opened, the part being disposed on the upper side of multiple openings 5k, so that a bonding wire 9 is connected to the thick film electrode 6. Preferably, the terminal protection film 7 is made of a poly-imide resin film, and the thickness of the terminal protection film 7 is thicker than that of the thick film electrode 6.

Function and effect of the semiconductor device H1 shown in FIG. 1(a) according to the present invention in a case where a bonding connection is performed is explained with reference to FIG. 1(b).

As shown in FIG. 1(b), the impact-absorbing beam 5h is packed with the collecting electrode 4 and the thick film electrode 6. The impact-absorbing beam 5h together with the thick film electrode 6 function to reduce and to absorb the bonding impact such as load and supersonic vibration when the bonding wire 9 is bonded. The load in a case where the bonding wire 9 is bonded is supported on the impact-absorbing beam 5h so that the load is prevented from transmitting to a structure disposed on a lower side of the collecting electrode 4.

Further, Preferably, the bottom of the concavity disposed on the surface of the thick film electrode 6 is disposed on the upper side of the surface of the impact-absorbing beam 5h of the interlayer protection film 5 (i.e., D>0). The concavity is attributed to the opening 5k of the interlayer protection film 5. By this construction, the supersonic vibration in case of bonding connection is mainly reduced and absorbed by elastic deformation and plastic deformation of the surface portion of the thick film electrode 6. Furthermore, the impact-absorbing beam 5h prevents the stress of the supersonic vibration transmitting through the thick film electrode 6 from transmitting to a structure disposed on a lower side of the collecting electrode 4.

As described above, according to the semiconductor device H1 of the present invention, the bonding impact is prevented from transmitting to the power element region disposed on the lower side of the collecting electrode 4 when the bonding wire 9 is connected. Further, failure at the power element region is prevented from occurring. Furthermore, in the construction of the semiconductor device H1, the terminal protection film 7 covers the thick film electrode 6, and a region of the terminal protection film 7, which is necessary for the bonding, is opened. Therefore, there is no problem regarding the contact of the needle in case of the probe operation. Further, the bonding strength is not reduced since the bonding wire 9 and the surface of the thick film electrode 6 are directly bonded in case of the bonding connection. In addition, since the device has the construction that the impact-absorbing beam 5h is packed with the thick film electrode 6 and the collecting electrode 4, the thick film electrode 6 and the collecting electrode 4 are initially and electrically connected together so that the device H1 has the fail safe construction for preventing failure such as short-circuit between electrodes even if the impact-absorbing beam 5h is broken down when the bonding impact is reduced and absorbed.

FIGS. 2(a), 2(b), 3(a) and 3(b) show preferable planar shapes of the opening 5k formed in the interlayer protection film 5.

Figure 2A:
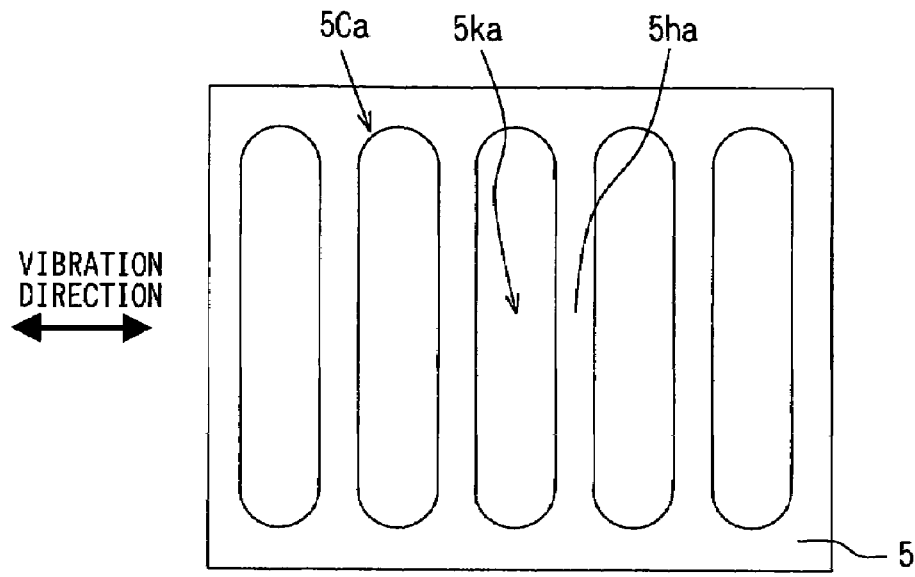
FIGS. 2A and 2B are views showing preferable planar shapes of an opening formed in an interlayer protection film.
Figure 2B:
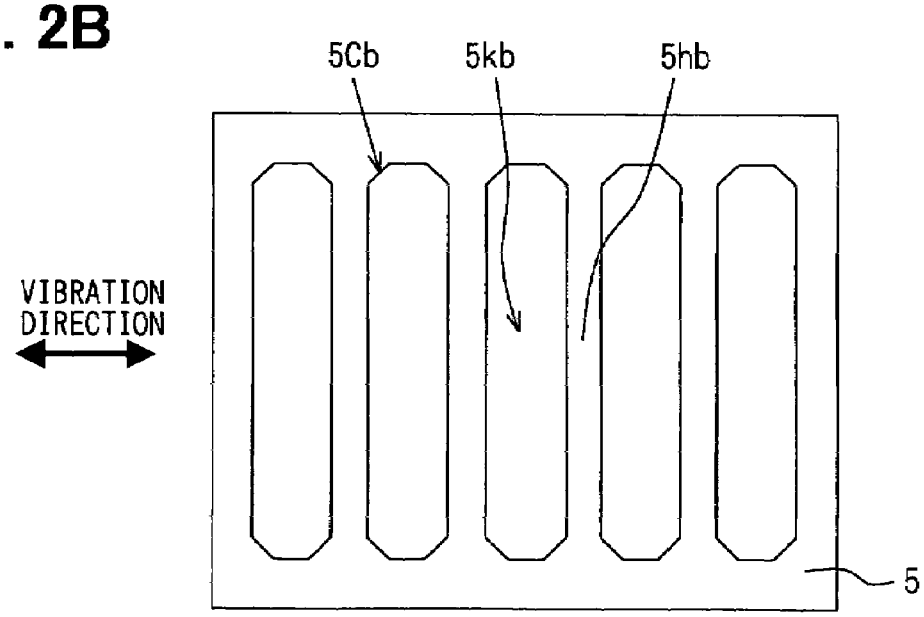

The openings 5ka, 5kb shown in FIGS. 2(a) and 2(b) have an opening shape, in which one side is longer than the other side. Multiple openings 5ka, 5kb are adjacently disposed in such a manner that longer sides of the openings 5ka, 5kb are in parallel. The supersonic vibration is applied to the device perpendicularly to the impact-absorbing beam 5ha, 5hb on the substrate surface so that the supersonic vibration in case of bonding connection is absorbed by the impact-absorbing beam 5ha, 5hb when the bonding wire 9 is connected, as shown in FIGS. 1(a) and 1(b). A corner 5Ca of the opening 5ka shown in FIG. 2(a) is rounded so that the stress concentration caused by the bonding impact is prevented from occurring. Another corner 5Cb of the opening 5kb shown in FIG. 2(b) is also chamfered so that the stress concentration is prevented from occurring.

Figure 3A:
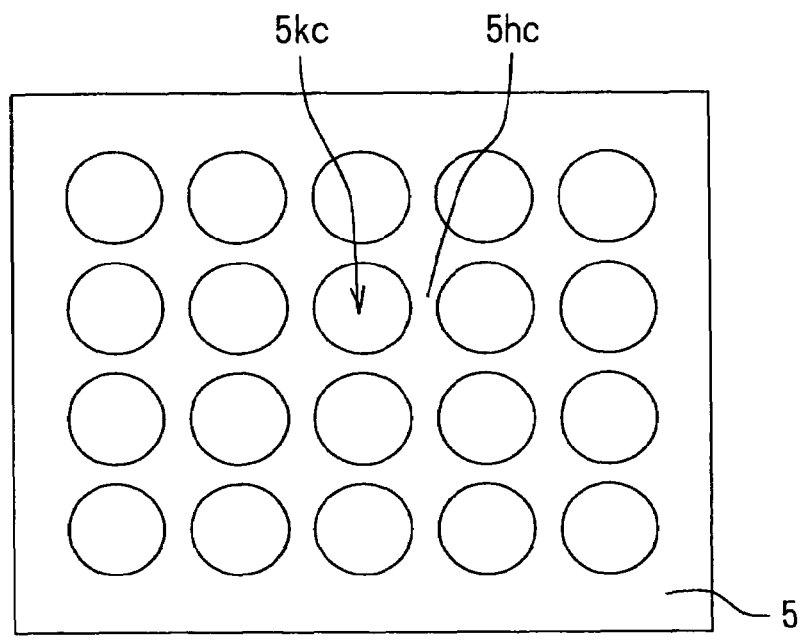
FIGS. 3A and 3B are views showing other preferable planar shapes of an opening formed in an interlayer protection film.
Figure 3B:
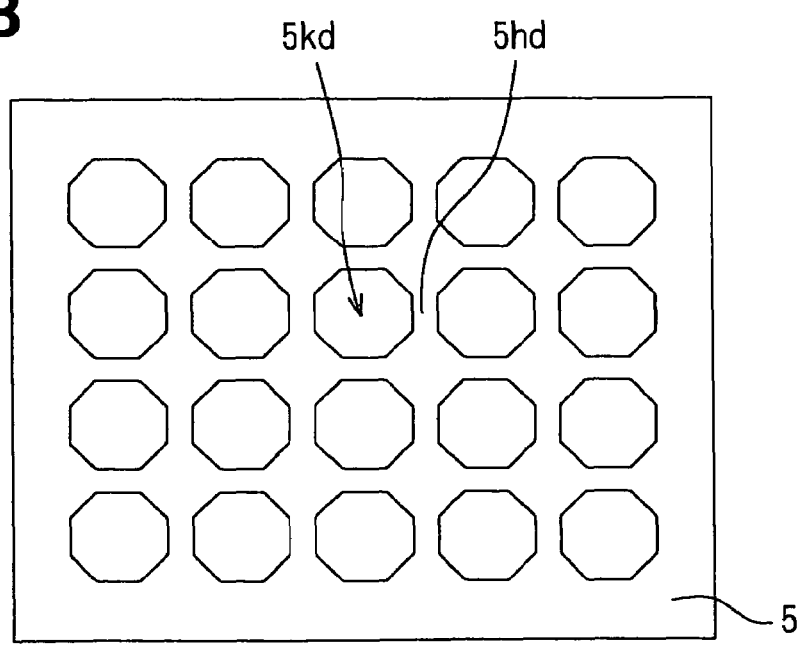

The openings 5kc, 5kd shown in FIGS. 3(a) and 3(b) have planar shapes of circle and polygon (e.g., octagonal shape), respectively. Multiple openings 5kc, 5kd are adjacently and isotropically disposed at even intervals in a right-left direction and in an upper-lower direction of the drawings. Accordingly, even when the vibration direction of the supersonic wave when the bonding wire 9 is connected is any direction on the substrate surface, as shown in FIGS. 1(a) and 1(b), the vibration is applied to the impact-absorbing beam 5hc, 5hd in a similar manner.

Each opening 5ka, 5kb shown in FIGS. 2(a) and 2(b) has a total opening area of whole openings, which is larger than that of the opening 5kc, 5kd shown in FIGS. 3(a) and 3(b). Therefore, contact resistance is much reduced.

On the other hand, regarding the openings 5kc, 5kd shown in FIGS. 3(a) and 3(b), the vibration direction of the supersonic wave in case of bonding can be set any direction on the substrate surface. Therefore, degree of freedom regarding the bonding direction becomes higher. Further, since the total opening area of whole openings is small, impact-absorbing efficiency of the impact-absorbing beam 5hc, 5hd is higher than that of the beam 5ha, 5hb.

Accordingly, in the semiconductor device H1 shown in FIG. 1(a), failure caused by the bonding impact such as the load and the supersonic vibration is prevented from occurring. Accordingly, the bonding wire 9 can be directly bonded to the thick film electrode 6 formed on the unit cell without forming a special pad around the unit cell for the bonding connection.

Figure 4:
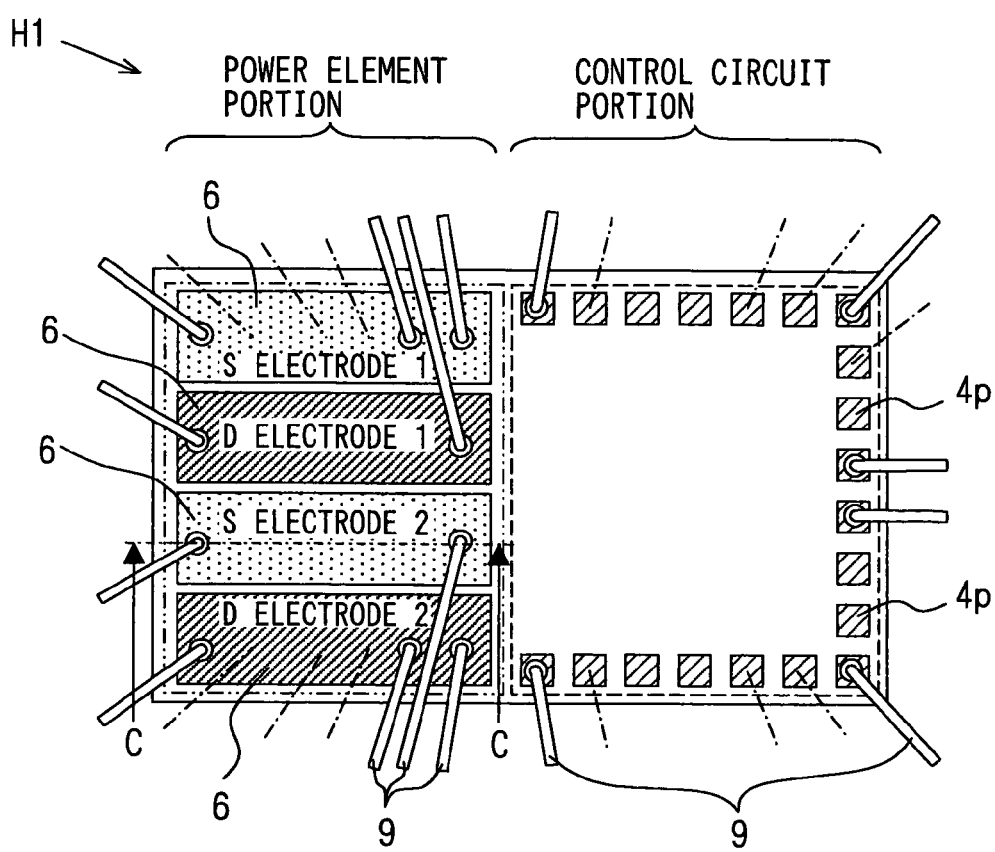
FIG. 4 is a top view showing an example of a power element combined integration type semiconductor device according to the first embodiment.

FIG. 4 is a top view showing an example of a power element combined integration type semiconductor device, which is provided by combining the power element and the control circuit in the semiconductor device H1 shown in FIG. 1(a). Here, FIG. 1(a) corresponds to the cross section taken along line C-C in FIG. 4. As shown in FIG. 4, in the power element portion, the bonding wire 9 is directly boned to the thick film electrode 6 of each source and drain formed in the unit cell.

Thus, in the power element combined integration type semiconductor device, the bonding wire is directly bonded to the power element portion without occurring the failure of the power element portion. Thus, the pad electrode in the prior art formed on outside of the power element portion for outputting to an external circuit can be removed. The reduction of the pad electrode provides reduction of wiring resistance of the power element portion. Further, the area of the power element combined integration type semiconductor device is reduced, and a manufacturing cost of the power element combined integration type semiconductor device can be reduced.

FIGS. 5(a) to 7(b) are cross sectional views explaining a method for manufacturing the semiconductor device H1 shown in FIG. 1(a). The method for manufacturing the semiconductor device H1 shown in FIG. 1(a) is described with reference to FIGS. 5(a) to 7(b).

Figure 5A:
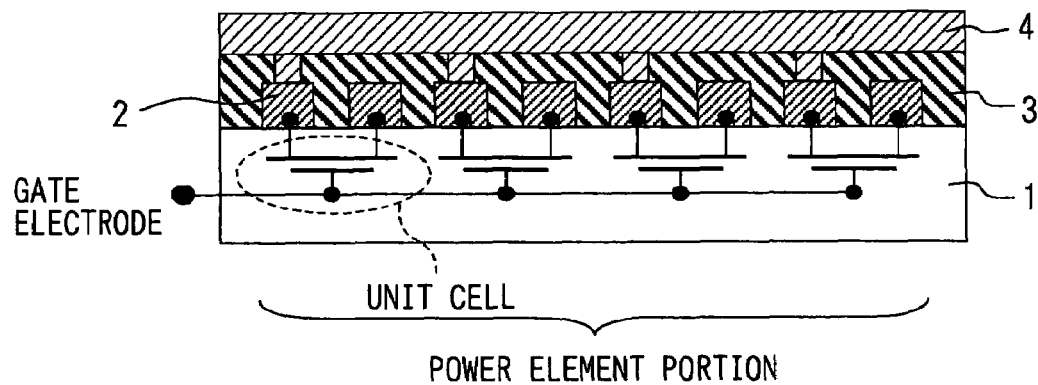
FIGS. 5A to 5C are cross sectional views showing each step in a manufacturing method of the semiconductor device according to the first embodiment.
Figure 5B:
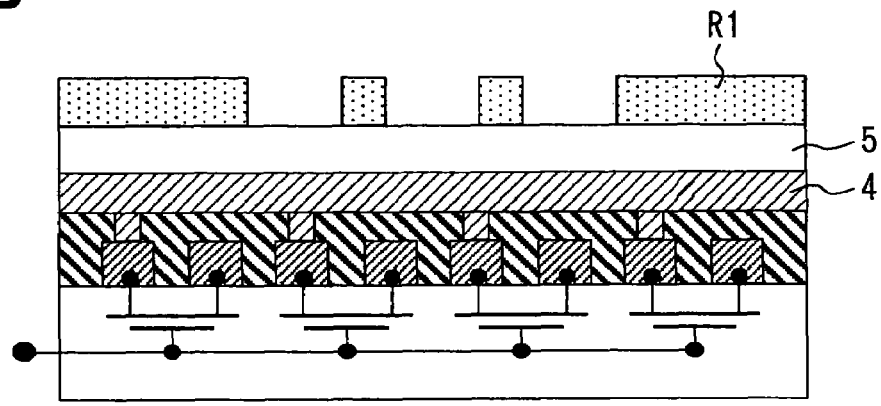

As shown in FIG. 5(a), multiple power MOS unit cells are formed in the semiconductor substrate 1. The lead wire 2 is formed to connect to each of the source and the drain through the contact hole for retrieving electric potential. Multiple lead wires 2 of each of the source and the drain are connected in parallel through the via hole so that the collecting electrode 4 for collecting electric potentials is provided in the semiconductor substrate. The interlayer protection film 5 is formed on the substrate to protect the collecting electrode 4, as shown in FIG. 5(b).

Figure 5C:
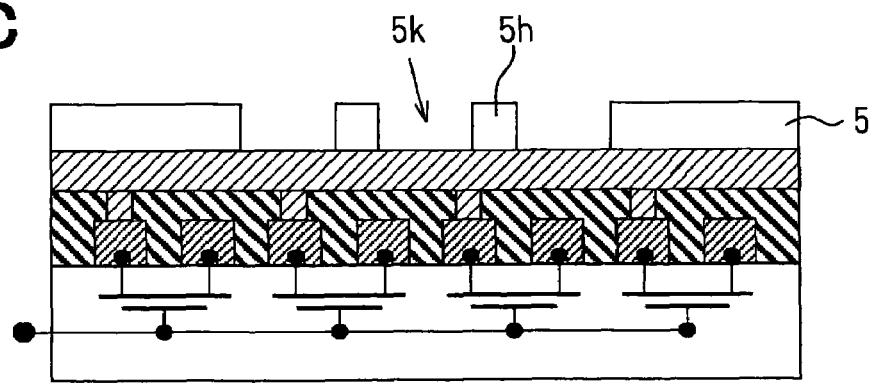

Next, as shown in FIG. 5(c), multiple openings 5k having a predetermined planar shape are formed in the interlayer protection film 5 by using a resist R1 as a mask. Thus, the impact-absorbing beam 5h is formed between the neighboring openings 5k.

Figure 6A:
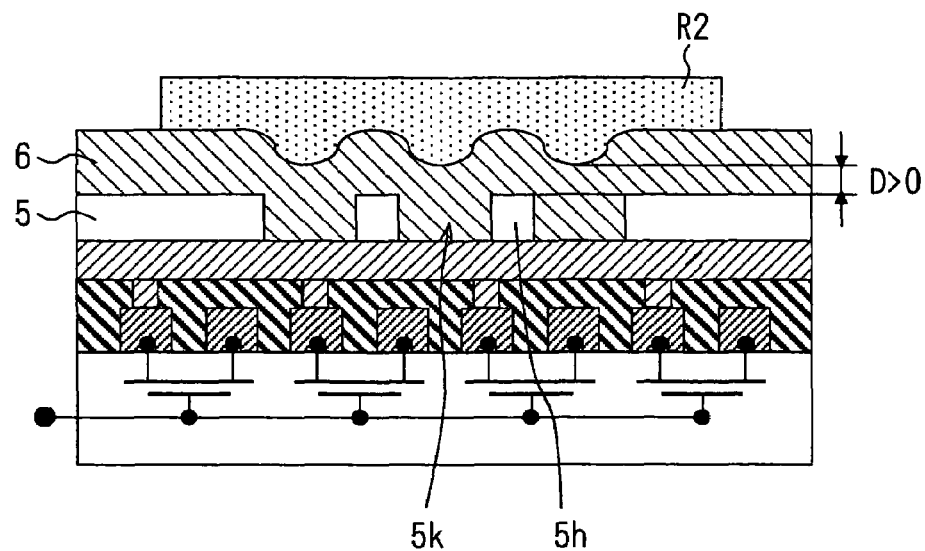
FIGS. 6A and 6B are cross sectional views showing each step in the manufacturing method of the semiconductor device according to the first embodiment.

Next, as shown in FIG. 6(a), a metal film made of the same material as the collecting electrode for forming the thick film electrode 6 is formed on the interlayer protection film 5 through multiple openings 5k. Preferably, the material of the metal film for connecting to the collecting electrode 4 and for forming the thick film electrode 6 is aluminum or aluminum alloy.

Further, the thickness of the metal film is set to be a predetermined thickness so that the bottom of the concavity formed on the surface of the thick film electrode 6 and attributed to the opening 5k is disposed on the upper side of the surface of the interlayer protection film 5 (i.e., D>0).

Figure 6B:
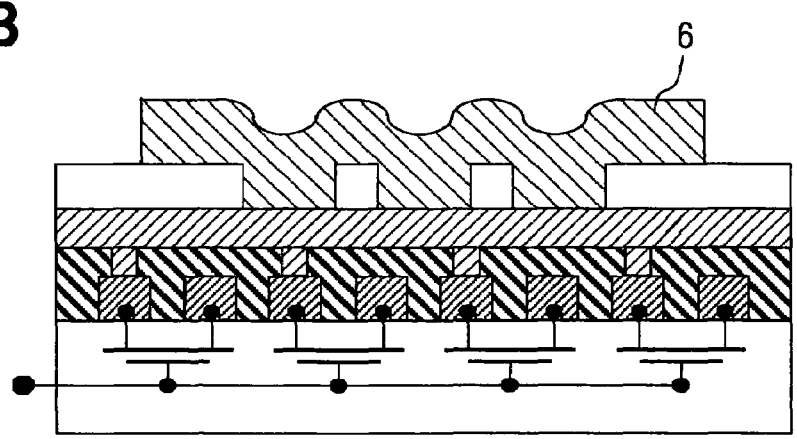

Next, the metal film is processed by using a resist R2 as a mask, so that the thick film electrode 6 is formed. [FIG. 6(b)] Preferably, this process is performed by a wet etching method in order to protect the unit cell disposed under the electrode 6 from damage.

Figure 7A:
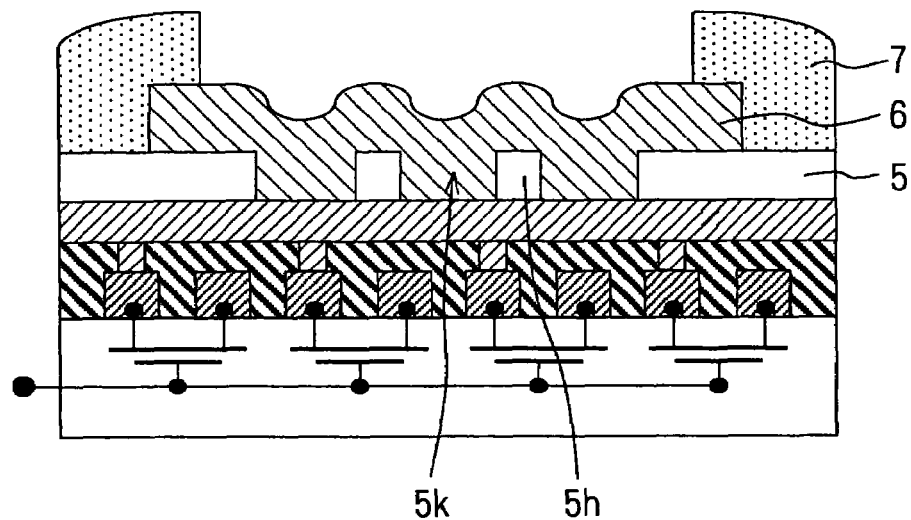
FIGS. 7A and 7B are cross sectional views showing each step in the manufacturing method of the semiconductor device according to the first embodiment.

Next, as shown in FIG. 7(a), the thick film electrode 6 is covered with the terminal protection film 7, a part of which is opened and necessary for the bonding connection of the thick film electrode 6. Preferably, the material of the terminal protection film 7 is poly-imide resin, and the thickness of the film 7 is thicker than that of the thick film electrode 6.

Figure 7B:
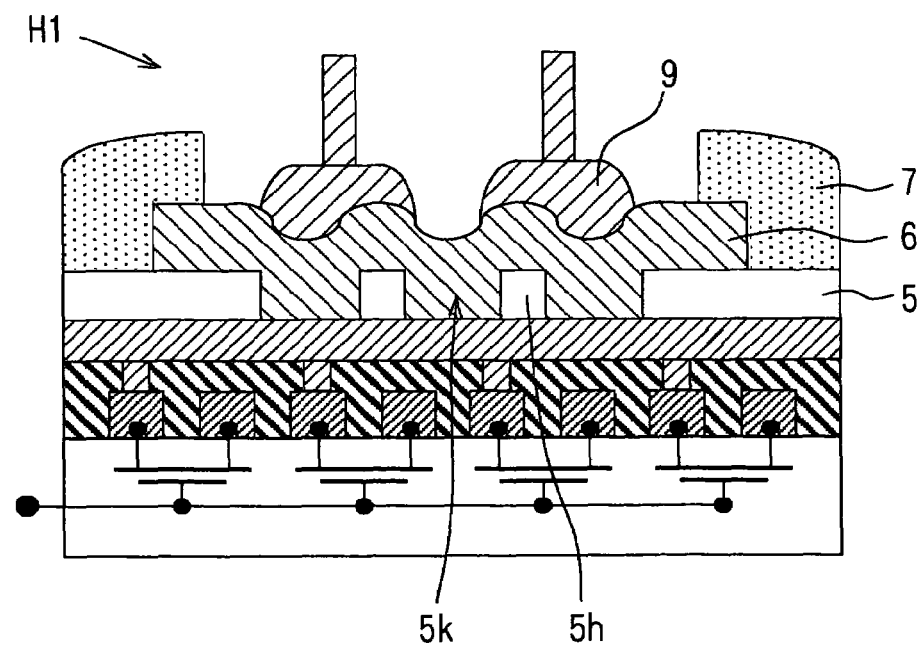

Finally, as shown in FIG. 7(b), the bonding wire 9 is connected to a predetermined surface of the thick film electrode 6 formed on multiple impact-absorbing beams 5h.

Second Embodiment

Figures 8, 9:
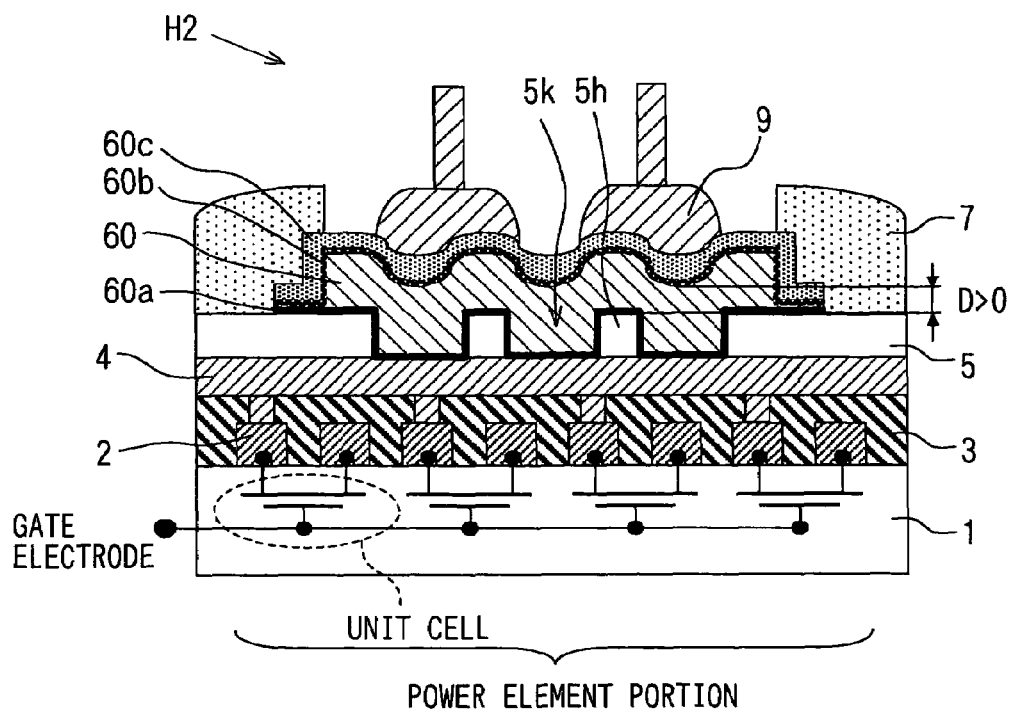
FIG. 8 is a schematic cross sectional view showing a semiconductor device according to a second embodiment.
FIG. 9 is a table showing comparison of elastic modulus and specific resistance in different metallic materials.

FIG. 8 is a schematic view showing a semiconductor device H2 according to a second embodiment of the present invention. In the semiconductor device H2 of this embodiment shown in FIG. 8, similar to the semiconductor device H1 according to the first embodiment, multiple power element unit cells are formed on the surface portion of the silicon substrate 1. Here, the construction disposed under the collecting electrode 4 in the semiconductor device H2 shown in FIG. 8 is similar to that of the semiconductor device H1 shown in FIG. 1(a); and therefore, the description of the construction is skipped.

In the semiconductor device H2 shown in FIG. 8, the interlayer protection film 5 is formed on the collecting electrode 4 made of aluminum or aluminum alloy, similar to the semiconductor device Hi shown in FIG. 1(a). Further, multiple openings 5k are adjacently disposed in the interlayer protection film 5 so that the impact-absorbing beam 5h is formed of the interlayer protection film 5 between the neighboring openings 5k.

In the semiconductor device H2 shown in FIG. 8, differently from the semiconductor device H1 shown in FIG. 1(a), a thick film electrode 60 is formed on the interlayer protection film 5. The electrode 60 is made of a material having mechanical strength higher than that of the collecting electrode 4, and connected to the collecting electrode 4 through a first barrier layer 60a in multiple openings 5k. Further, an aluminum film or an aluminum alloy film 60c covers the top and whole side surfaces of the thick film electrode 60 through a second barrier layer 60b for limiting metal reaction. The aluminum film or the aluminum alloy film has excellent bonding property bonding to the bonding wire 9.

The first barrier layer 60a is a film for preventing metallic reaction to the collecting electrode 4. Preferably, the layer 60a is made of titanium, titanium nitride, titanium-tungsten or a multi-layered film thereof. The material of the thick film electrode 60 has mechanical strength higher than that of the collecting electrode 4. As shown in FIG. 9, preferably, the material of the electrode 60 has mechanical strength, i.e., elastic modulus higher than that of aluminum, and specific resistance lower than that of aluminum. In addition, preferably, the second barrier layer 60c is made of the same material as the first barrier layer 60a, i.e., titanium, titanium nitride, titanium-tungsten or a multi-layered film thereof.

Further, in the semiconductor device H2 shown in FIG. 8, similar to the power element combined integration type semiconductor device H1 shown in FIG. 1(a), the terminal protection film 7 for covering the thick film electrode 60 is formed on the top surface of the silicon substrate 1. A part of the terminal protection film 7 disposed on the upper side of multiple openings 5k is opened so that the bonding wire 9 is connected to the thick film electrode 60. Preferably the terminal protection film 7 is made of a poly-imide resin film, and the thickness of the terminal protection film 7 is thicker than that of the thick film electrode 60.

In the semiconductor device H2 shown in FIG. 8, similar to the semiconductor device H1 shown in FIG. 1(a), the impact-absorbing electrode 4 is packed with the collecting electrode 4 and the thick film electrode 60.

Accordingly, the impact-absorbing beam 5h in the semiconductor device H2 together with the thick film electrode 60 functions to reduce and to absorb the bonding impact such as pressurization and supersonic vibration when the bonding wire 9 is connected. Specifically, the load in case of connection of the bonding wire 9 is supported by the impact-absorbing beam 5h so that the load is prevented from transmitting to the structure disposed on the lower side of the collecting electrode 4. Further, as shown in FIG. 8, the thickness of the thick film electrode 60 is determined in such a manner that the bottom of the concavity on the surface of the impact-absorbing electrode 60 is disposed on the upper side of the surface of the impact-absorbing beam 5h formed of the interlayer protection film 5 (i.e., D>0), the concavity being attributed to the opening 5k of the interlayer protection film 5. Thus, the stress attributed to the supersonic vibration is absorbed and reduced.

In the semiconductor device H2 having the above construction shown in FIG. 8, differently from the semiconductor device H1 shown in FIG. 1(a), the supersonic vibration in case of bonding connection is reduced and absorbed by elastic deformation and, plastic deformation of the surface portion of the aluminum film or the aluminum alloy film 60c, which mainly covers the thick film electrode 60. The stress of the supersonic vibration transmitting through the thick film electrode 60 is dispersed by the thick film electrode 60 made of the material having the mechanical strength higher than that of the collecting electrode 4 disposed on the lower side of the electrode 60. Further, the impact-absorbing beam 5h prevents the stress from transmitting to the structure disposed on the lower side of the collecting electrode 4.

Preferably, in the semiconductor device H2, the planar shape of the opening 5k formed in the interlayer protection film 5 is the shape shown in FIGS. 2(a), 2(b), 3(a) or 3(b).

Accordingly, in the semiconductor device H2 shown in FIG. 8, failure at the power element portion caused by the bonding impact such as the pressurization and the supersonic vibration is prevented from occurring. Accordingly, it is possible to increase reliability of the bonding to the thick film electrode 6 formed on the unit cell.

In addition, in the semiconductor device H2 shown in FIG. 8, similar to the semiconductor device H1 shown in FIG. 1(a), there is no problem regarding the contact of the probe operation. The bonding strength of the bonding wire 9 is not deteriorated. Further, even if the impact-absorbing beam 5h is broken down when the bonding impact is reduced and absorbed, failure such as short-circuit between electrodes in the power element portion does not occur. Thus, the fail safe construction is provided.

Here, a manufacturing method of semiconductor device H2 shown in FIG. 8 is explained together with a method for manufacturing a semiconductor device described as follows.

Third Embodiment

Figure 10A:
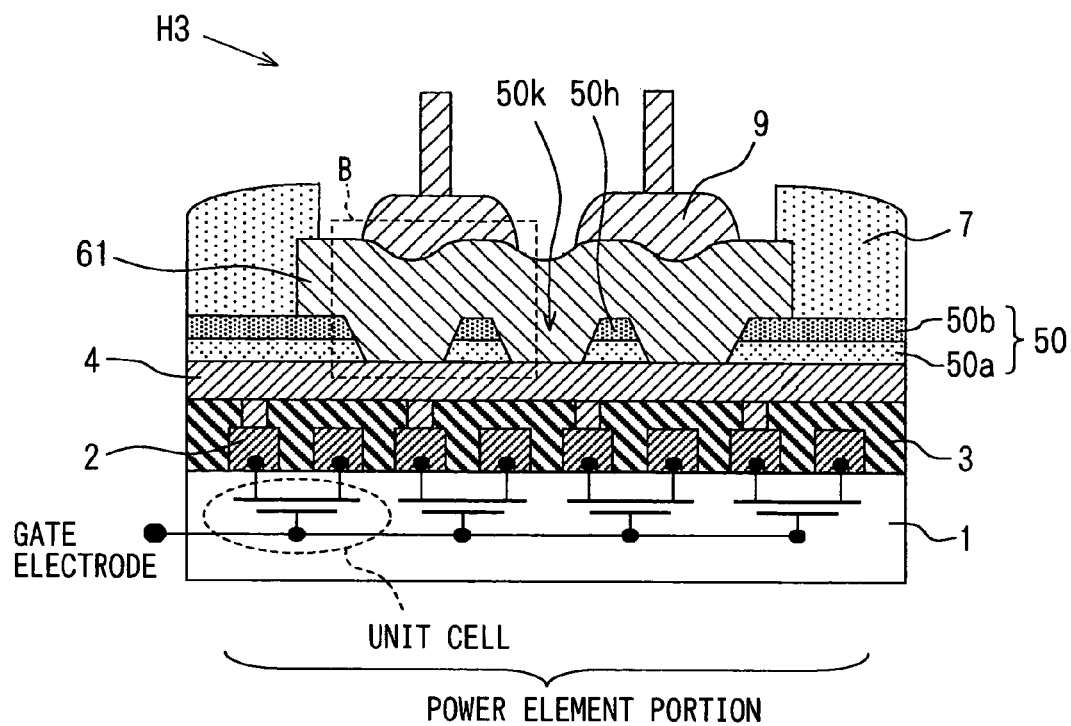
FIG. 10A is a schematic cross sectional view showing a semiconductor device according to a third embodiment.
Figure 10B:
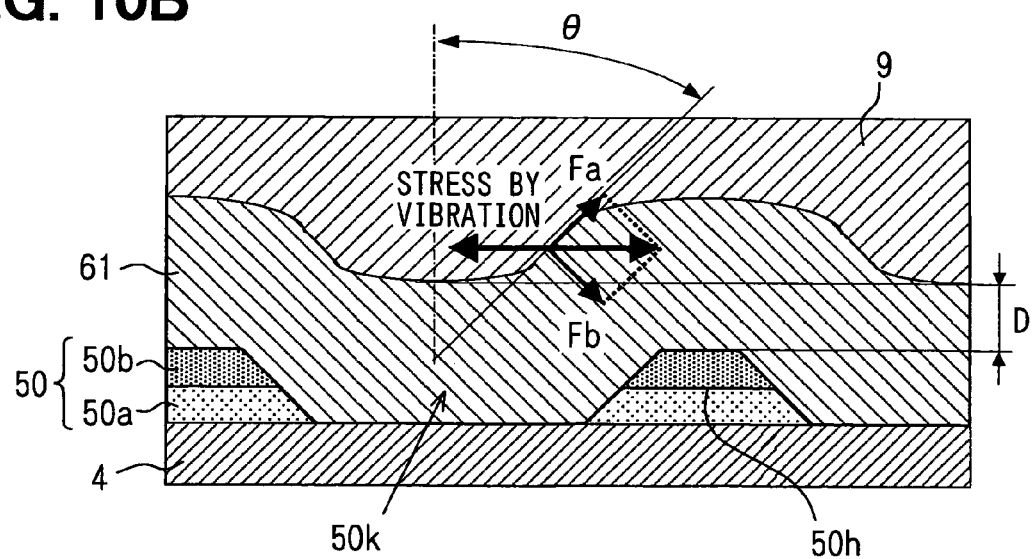
FIG. 10B is a partially enlarged view showing a B-part surrounded with a broken line in FIG. 10(a) and explaining function and effect.

FIG. 10(a) is a schematic cross sectional view showing a semiconductor device H3 according to this embodiment. FIG. 10(b) is a partially enlarged view showing a B-portion surrounded with a broken line in FIG. 10(a), and the view explaining function and effect of this embodiment.

In the semiconductor device H3 shown in FIG. 10(a), similar to the semiconductor devices H1, H2 according to the first and the second embodiments, the power element unit cells are disposed on the surface portion of the silicon substrate 1. Here, in the semiconductor device H3 shown in FIG. 10(a), the construction disposed under the collecting electrode 4 is similar to that of the power element combined integration type semiconductor device Hi shown in FIG. 1(a); and therefore, the description of the construction is skipped.

In the semiconductor device H3 shown in FIG. 10(a), the interlayer protection film 50 is formed on the collecting electrode 4. The interlayer protection film 50, differently from the semiconductor devices H1, H2 shown in FIGS. 1(a) and 8, is a binary-layered film composed of a lower dielectric layer 50a and an upper dielectric layer 50b. Preferably, the lower dielectric layer 50a is made of dielectric material having high adhesiveness to the collecting electrode 4 such as a silicon oxide film. The upper dielectric layer 50b is made of dielectric material having adhesiveness to the thick film electrode 61 such as a silicon nitride film. Further, multiple openings 50k are adjacently disposed in the interlayer protection film 50. The opening 50k has a cross section of a tapered shape. The impact-absorbing beam 50h is formed of the interlayer protection film 50 between the neighboring openings 50k.

In the semiconductor device H3 shown in FIG. 10(a), a thick film electrode 61 connecting to the collecting electrode 4 is formed on the interlayer protection film 50 through multiple openings 50k. The thick film electrode 61 can be made of the same material as the collecting electrode 4, similar to the power element combined integration type semiconductor device H1 according to the first embodiment. Alternatively, the electrode 61 may be made of other metallic materials. Further, similar to the semiconductor device H2, the thick film electrode 61 may be made of the material having the mechanical strength higher than that of the collecting electrode 4. The electrode 61 may be connected to the collecting electrode 4 through the first barrier layer. The top and whole side surfaces of the thick film electrode 61 may be covered with the aluminum film or the aluminum alloy film through the second barrier layer. Here, the concavity attributed to the opening 50k on the surface of the thick film electrode 61 has a gradual tapered shape, compared with the tapered shape of the cross section of the opening 50k. Preferably, a taper angle (i.e., an angle θ in FIG. 10(b)) of the concavity on the surface of the thick film electrode 61 is equal to or larger than 45 degrees.

In the semiconductor device H3 shown in FIG. 10(a), similar to the semiconductor devices H1, H2 shown in FIGS. 1(a) and 8, the terminal protection film 7 covering the thick film electrode 61 is formed on the top surface of the silicon substrate 1. A part of the terminal protection film 7 disposed on the upper side of multiple openings 50k is opened so that the bonding wire 9 is connected to the thick film electrode 61. Preferably, the terminal protection film 7 is made of polyimide resin film, and the thickness of the terminal protection film 7 is thicker than that of the thick film electrode 61.

In the semiconductor device H3 shown in FIG. 10(a), similar to the semiconductor devices H1, H2 shown in FIGS. 1(a) and 8, the impact-absorbing beam 50h is packed with the thick film electrode 61 and the collecting electrode 4. Accordingly, the beam 50h in the semiconductor device H3 together with the thick film electrode 61 functions to reduce and to absorb the bonding impact such as the pressurization and the supersonic vibration when the bonding wire 9 is connected. Specifically, the load in case of connection of the bonding wire 9 is supported by the impact-absorbing beam 50h so that the load is prevented from transmitting to the structure disposed on the lower side of the collecting electrode 4.

Further, as shown in FIG. 10(b), the thickness of the thick film electrode 61 is determined in such a manner that the bottom of the concavity on the surface of the thick film electrode 61 attributed to the opening 50k of the interlayer protection film 50 is disposed on the upper side of the surface of the impact-absorbing beam 50h formed of the interlayer protection film 50 (i.e., D>0). Thus, the stress attributed to the supersonic vibration is reduced and absorbed. In this construction, the supersonic vibration in case of bonding connection is mainly reduced and absorbed by elastic deformation and plastic deformation of the surface portion of the thick film electrode 61. Further, the impact-absorbing beam 50h prevents the stress of the supersonic vibration transmitting through the thick film electrode 61 from transmitting to the structure disposed on the lower side of the collecting electrode 4.

Here, in the semiconductor device H3, preferably, the planar shape of the opening 50k formed in the interlayer protection film 50 is the shape shown in FIGS. 2(a), 2(b), 3(a) or 3(b).

On the other hand, in the semiconductor device H3 shown in FIG. 10(a), differently from the semiconductor devices H1, H2 shown in FIGS. 1(a) and 8, the cross section of the opening 50k has a tapered shape. Therefore, the thick film electrode 61 has excellent step coverage, and the concavity on the surface of the thick film electrode 61 attributed to the opening

50k has a gradually tapered shape. The stress caused by the supersonic vibration as a main factor of the bonding impact can be decomposed to a stress composition Fa along with an action surface and a stress composition Fb perpendicular to the action surface, the action surface having a tapered shape shown in FIG. 10(*b*). Since the concavity has the gradually tapered shape, it is possible to reduce the stress composition Fb perpendicular to the action surface. Since the stress composition Fb perpendicular to the action surface is reduced, the main bonding impact can be reduced and absorbed by the surface portion of the thick film electrode 61. Thus, the failure at the structure disposed on the lower side of the colleting electrode 4 is prevented from occurring. Further, reliability of the bonding connection directly bonding to the power element portion is much increased.

Here, in the semiconductor device H3 shown in FIG. 10(*a*), similar to the semiconductor devices H1, H2 shown in FIGS. 1(*a*) and 8, there is no problem regarding contact of the needle in case of the probe operation. Further, deterioration of the bonding strength of the bonding wire 9 does not reduced. Further, even if the impact-absorbing beam 50*h* is broken down when the bonding impact is reduced and absorbed, failure such as short-circuit between electrodes in the power does not occur. Thus, the device has the fail safe construction.

The method for manufacturing the semiconductor devices according to the second and the third embodiments of the present invention is explained as follows with using a semiconductor device H4 as an example having a construction provided by combining the semiconductor device H2 shown in FIG. 8 and the semiconductor device H3 shown in FIG. 10(*a*).

Figure 11:
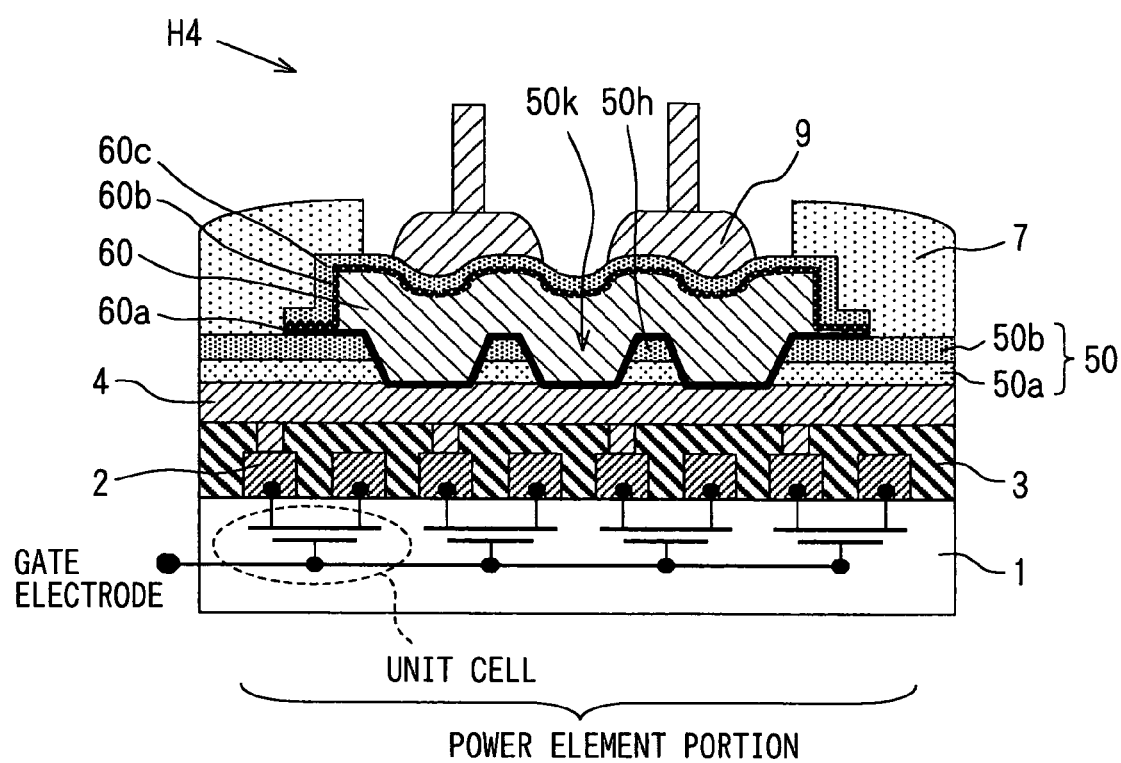
FIG. 11 is a schematic cross sectional view showing a semiconductor device having a construction combined the semiconductor device shown in FIG. 8 and the semiconductor device shown in FIG. 10A.

FIG. 11 is a schematic cross sectional view showing the semiconductor device H4. Here, a part in the semiconductor device H4 shown in FIG. 11 similar to a part of the power element combined integration type semiconductor device H2 shown in FIG. 8 and the semiconductor device H3 shown in FIG. 10(*a*) has the same reference number.

Figure 12A:
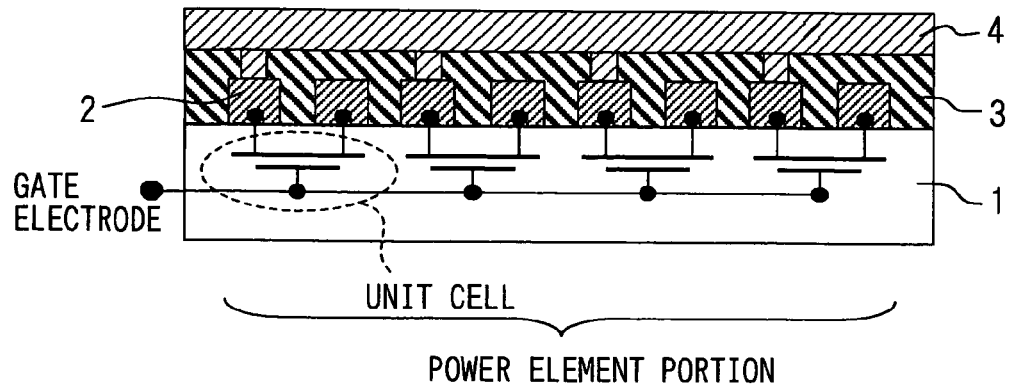
FIGS. 12A to 12C are cross sectional views showing each step in the manufacturing method of the semiconductor device shown in FIG. 11, according to the second embodiment and the third embodiment.
Figure 12B:
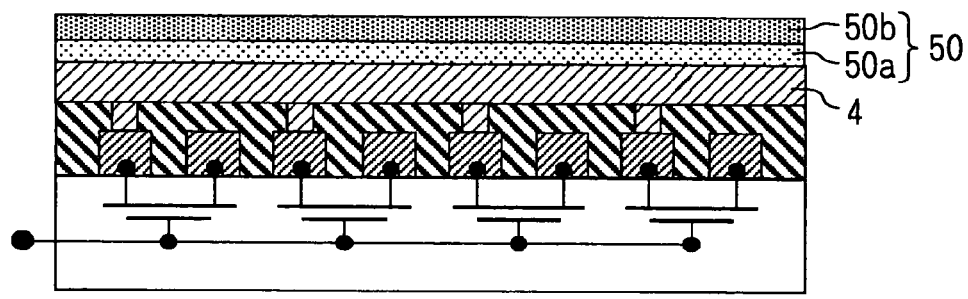
Figure 12C:
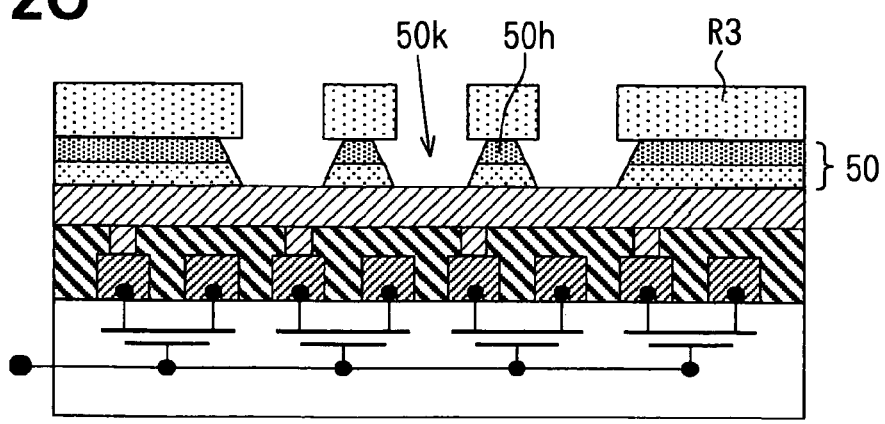

FIGS. 12(*a*) to 14(*b*) are cross sectional views showing each step in a method for manufacturing the semiconductor device H4 shown in FIG. 11.

As shown in FIG. 12(*a*), multiple power MOS unit cells are disposed on the semiconductor substrate 1. The lead wire 2 for retrieving electric potential is connected to the source and the drain through the contact hole. Multiple lead wires 2 of each of the source and the drain are connected in parallel through the via hole so that the collecting electrode for collecting the electric potential is provide. In this substrate, as shown in FIG. 12(*b*), the interlayer protection film 50 for protecting the collecting electrode 4 is provided such that the lower dielectric layer 50*a* and the upper dielectric layer 50*b* are formed in series. The lower dielectric layer 50*a* is made of a material having high adhesiveness to the collecting electrode 4 such as a silicon oxide film. The upper dielectric layer 50*b* is made of a silicon nitride film. The lower dielectric layer 50*a* made of the silicon-oxide film and the upper dielectric layer 50*b* made of the silicon nitride film are formed by, for example, a CVD method.

Next, as shown in FIG. 12(*c*), multiple openings 50*k* are formed in the interlayer protection film 50 by using a resist R3 having a predetermined pattern as a mask. The opening 50*k* has a cross section of a tapered shape. Thus, the impact-absorbing beam 50*h* is formed of the interlayer protection film 50 between the neighboring openings 50*k*.

Figure 13A:
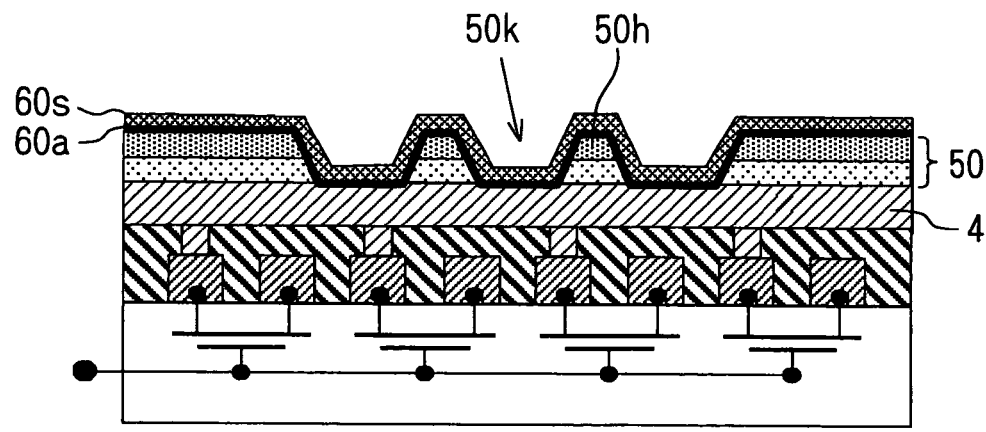
FIGS. 13A and 13B are cross sectional views showing each step in the manufacturing method of the semiconductor device shown in FIG. 11, according to the second embodiment and the third embodiment.
Figure 13B:
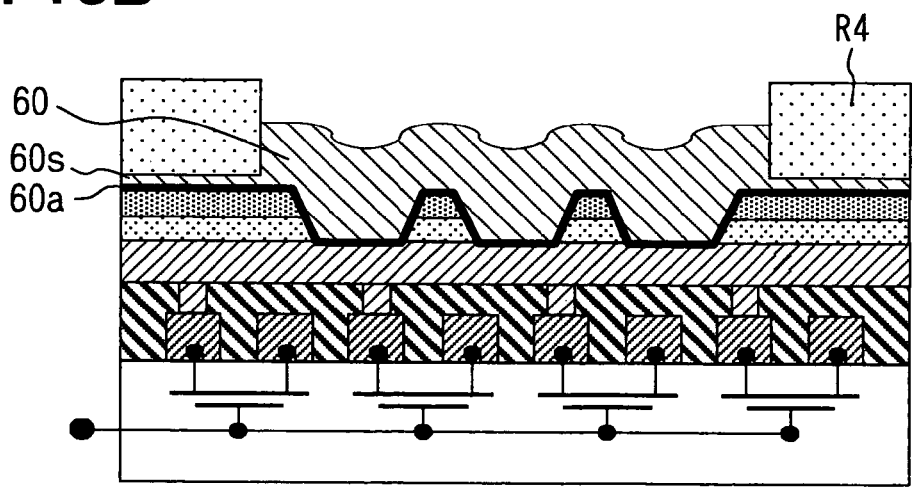

Next, as shown in FIG. 13(*a*), the first barrier layer 60*a* is deposited on the interlayer protection film 50 to cover the opening 50*k*. Successively, a copper seed layer 60*s* is deposited. At this time, preferably, the first barrier layer 60*a* and the copper seed layer 60*s* are deposited successively in vacuum. Further, the first barrier layer 60*a* limits metallic reaction between the collecting electrode 4 and the thick film electrode 60, which is formed in a later step. Preferably, the material of the first barrier layer 60*a* is titanium, titanium nitride, titanium-tungsten, or a stacked film thereof, the material having excellent adhesiveness to the upper dielectric layer 50*b* composing the interlayer protection film 50.

Next, as shown in FIG. 13(*b*), the thick film electrode 60 is formed such that the electrode 60 connects to the collecting electrode 4 through multiple openings 50*k*. Preferably, the thick film electrode 60 is made of a material having low specific resistance lower than that of the collecting electrode 4 and high mechanical strength higher than that of the collecting electrode 4, and formed by a deposition method under a deposition conditions, which provide high step coverage so that the electrode 60 covers the impact-absorbing beam 50*h* having the tapered shape. Further, the thickness of the upper electrode 60 is determined to be a predetermined thickness so that the bottom of the concavity on the surface of the thick film electrode film 60 caused by and attributed to the opening 50*k* is disposed on the upper side of the surface of the impact-absorbing beam 50*h* (i.e., D>0).

Accordingly, as shown in FIG. 13(*b*), a copper plating layer 60 is formed to have a predetermined pattern by using the resist R4 as a mask and the copper seed layer 60*s* as an electrode. Thus, the layer 60 is formed by an electro-plating method with low manufacturing cost and simple means. This copper plating layer 60 finally provides the upper electrode 60. Next, the resist R4 is removed. Then, a wet etching process without mask is performed so that excess copper seed layer 60*s* is removed. Thus, the thick film electrode 60 is formed.

Figure 14A:
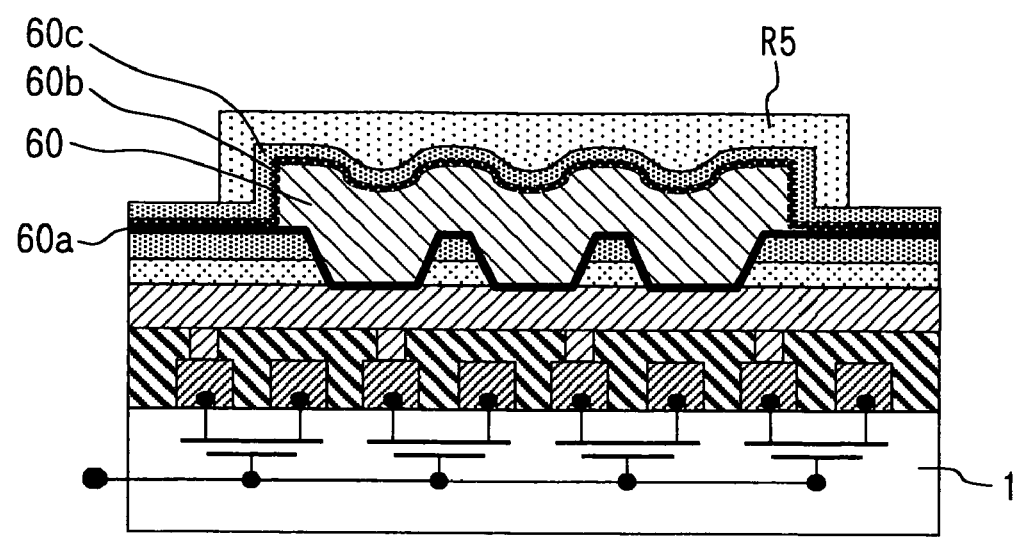
FIGS. 14A and 14B are cross sectional views showing each step in the manufacturing method of the semiconductor device shown in FIG. 11, according to the second embodiment and the third embodiment.
Figure 14B:
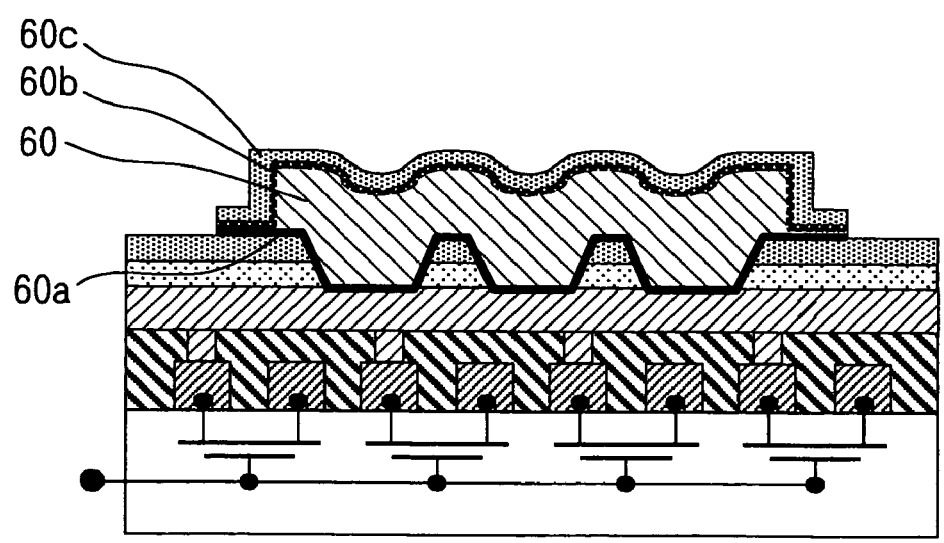
Figure 15:
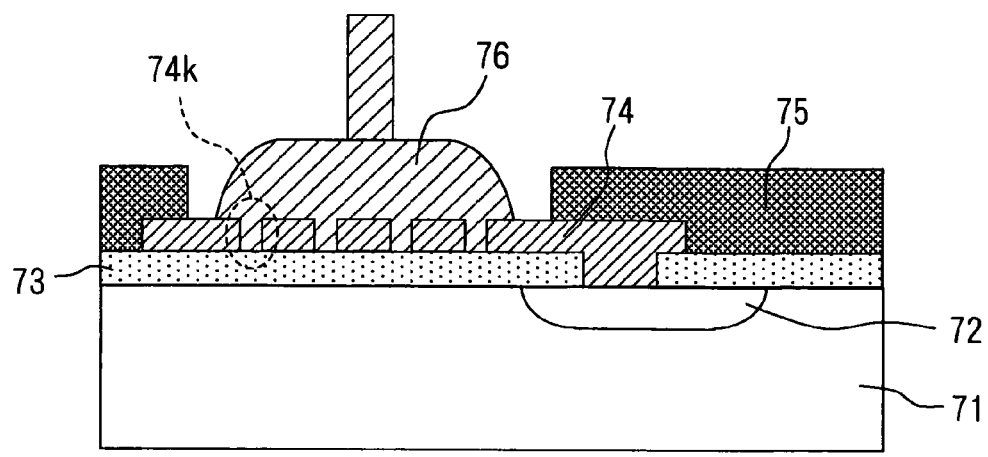
FIG. 15 is a schematic cross sectional view showing a pad electrode according to a first prior art.
Figure 16:
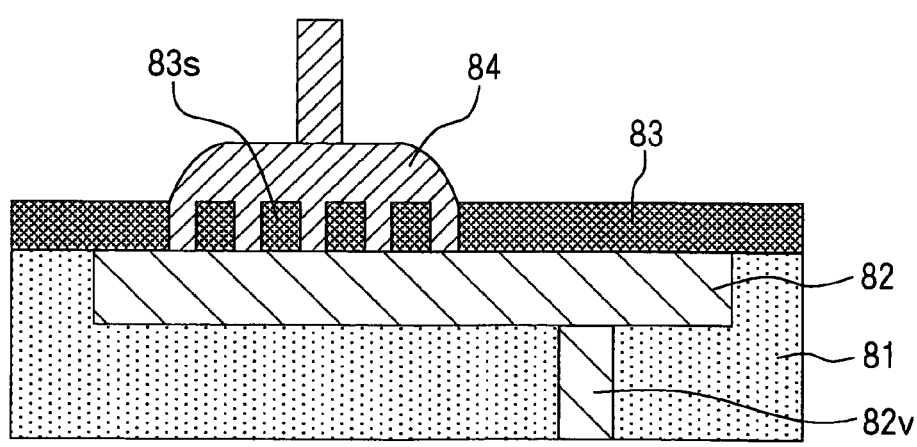
FIG. 16 is a schematic cross sectional view showing a pad electrode according to a second prior art.

Next, as shown in FIG. 14(*a*), the second barrier layer 60*b* is deposited on whole surface of the silicon substrate 1 in such a manner that the layer 60*b* completely covers the top and whole side surfaces of the thick film electrode 60. The second barrier layer 60*b* is made of titanium, titanium nitride, titanium-tungsten, or a stacked film thereof. Further, successively, an aluminum film or an aluminum alloy film 60*c* is deposited on whole surface of the silicon substrate 1. At this time, preferably, the second barrier layer 60*b* and the aluminum film or the aluminum alloy film 60*c* are deposited in vacuum and in series.

Further, a resist R5 having a predetermined pattern is formed to cover the thick film electrode 60 completely. Here, the resist R5 defines a planar size larger than the planar size of the thick film electrode 60 so that the planar shape of the second barrier layer 60*b* and the aluminum film or the aluminum alloy film 60*c* for covering the thick film electrode 60 covers the planar shape of the thick film electrode 60 therein.

Next, as shown in FIG. 14(*b*), excess aluminum film or aluminum alloy film, excess second barrier layer 60*b* and excess first barrier layer 60*a* are etched and removed successively by using the resist R5 as the mask. Preferably, this etching step is performed by a wet process method so that the unit cell disposed under the layer 60*a* is not damaged.

After that, the resist R5 is removed, so that the electrode construction of the semiconductor device H4 shown in FIG. 11 is completed.

Next, the terminal protection film 7 is formed to have a sufficient thickness so that the film 7 covers and protects the thick film electrode 60 shown in FIG. 11. Preferably, the material of the terminal protection film 7 is organic material such as a poly-imide resin film, in which no crack is generated in a case where the film 7 having the sufficient thickness is formed.

After that, a part of the terminal protection film 7 disposed on the upper side of multiple openings 50k is opened so that the bonding to the thick film electrode 60 is performed.

Finally, the bonding wire 9 is bonded to the upper electrode 60 exposed from the opening of the terminal protection film 7 by a supersonic bonding method.

Thus, the power element combined integration type semiconductor device H4 shown in FIG. 11 is manufactured. Here, the function and the effect of the manufactured power element combined integration type semiconductor device H4 are the same as those explained in the second and the third embodiments. Accordingly, their explanation is skipped.

Fourth Embodiment

Figure 17:
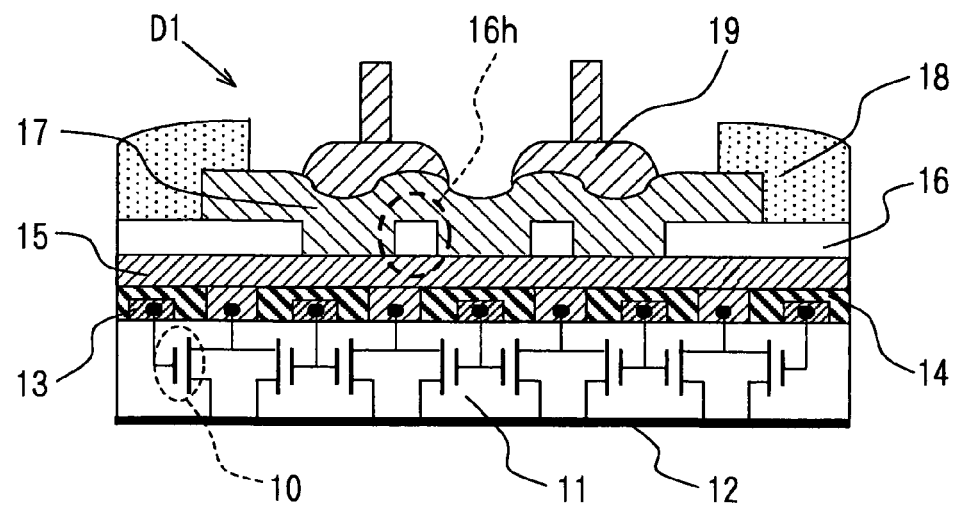
FIG. 17 is a schematic cross sectional view showing a semiconductor device according to a fourth embodiment of the present invention.

FIG. 17 schematically shows a semiconductor device D1 according to a fourth embodiment of the present invention.

In the semiconductor device D1 shown in FIG. 17, multiple unit cells 10 composing a vertical type power device, for example, a DMOS (i.e., diffused MOS), are formed on a silicon substrate 11. One of output terminals, for example, a drain terminal is connected in parallel to a backside electrode 12 disposed on a backside of the silicon substrate 1 so that the one of the output terminals electrically collects from the backside electrode 12. A control electrode 13 and a surface electrode 15 are formed. The control electrode 13 connects to a gate electrode for retrieving electric potential from the gate electrode. The surface electrode 15 is connected in parallel to the other one of output terminals, for example, a source terminal through multiple contact holes formed in an insulation layer 14 for covering the control electrode 13 so that the surface electrode 15 collects electrically from the source electrode.

The protection film 16 is formed on the surface electrode 15. Similar to the first embodiment, multiple openings are disposed adjacently in the protection film 16. An impact-absorbing beam 16h is formed of the protection film 16 between neighboring openings. On the protection film 16, a thick surface electrode 17 is formed. The thick surface electrode 17 is made of the same material as the surface electrode 15, and connected to the surface electrode 15 through multiple openings. Further, a terminal protection resin film 18 for covering the thick surface electrode 17 is formed on a top surface of the silicon substrate 1. A part of the terminal protection resin film 18 is opened on an upper side of multiple impact-absorbing beams 16h so that a bonding wire 19 is connected to the thick surface electrode 17.

The material of the surface electrode 15 is preferably made of aluminum or aluminum alloy formed by, for example, a sputtering method. The material of the protection film 16 is preferably made of a silicon nitride film formed by, for example, a CVD method. The preferable construction and constitution of the impact-absorbing beam 16h are similar to the construction and the constitution of the first embodiment. Therefore, detailed description thereof is skipped. Further, the thickness of the thick surface electrode 17 is preferably sufficiently thick so that the bottom of the surface concavity on the thick surface electrode 17 attributed to the opening is disposed on an upper side of the surface of the protection film 16. Furthermore, it is preferred that the terminal protection resin film 18 is made of a poly-imide resin film, and the thickness of the terminal protection resin film 18 is thicker than the thickness of the thick surface electrode 17.

The function and effect of the semiconductor device D1 according to the present invention shown in FIG. 17 is similar to that of the first embodiment when the bonding connection is performed. Thus, the detailed description thereof is skipped. Further, the manufacturing method of the device D1 is similar to that of the first embodiment after the protection film 16 is formed. Thus, the detailed description thereof is skipped.

Fifth Embodiment

Figure 18:
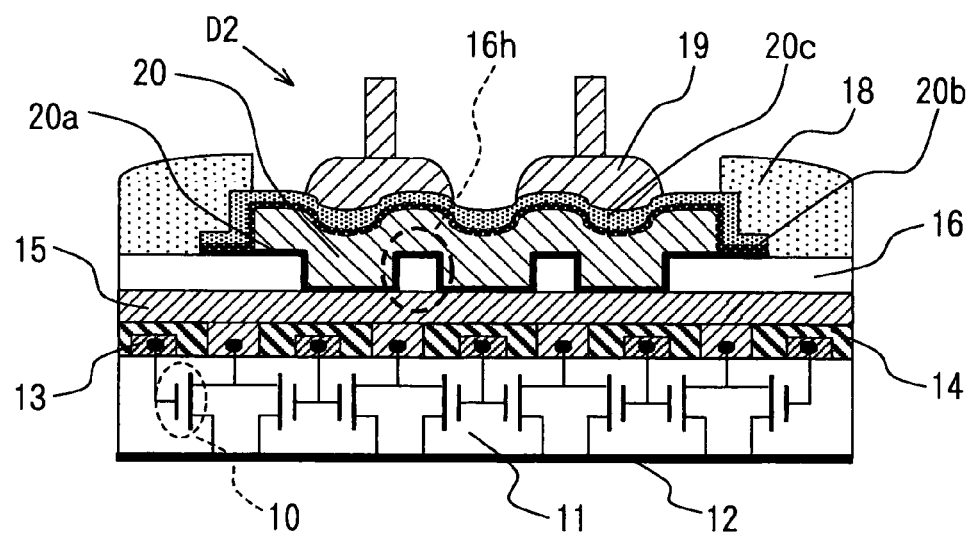
FIG. 18 is a schematic cross sectional view showing a semiconductor device according to a fifth embodiment of the present invention.

FIG. 18 schematically shows a semiconductor device D2 according to a fifth embodiment of the present invention.

The semiconductor device D2 shown in FIG. 18, similar to the semiconductor device D1 according to the fourth embodiment, is the semiconductor device having multiple unit cells 10 composing the vertical type device disposed in the silicon substrate 11. Here, in the semiconductor device D2, the construction disposed under the upper electrode 15 is similar to the semiconductor device D1 shown in FIG. 17. Therefore, the description thereof is skipped.

In the semiconductor device d2 shown in FIG. 18, the protection film 16 is formed on the upper electrode 15, similar to the semiconductor device D1 shown in FIG. 17. The upper electrode 15 is made of aluminum or aluminum alloy. Further, multiple openings are adjacently disposed in the protection film 16 so that the impact-absorbing beam 16h is formed of the protection film 16 between the neighboring openings.

On the other hand, in the semiconductor device D2 shown in FIG. 18, differently from the semiconductor device D1 shown in FIG. 17, a thick pad electrode 20 is formed on the protection film 16, which is similar to the second embodiment. The thick pad electrode 20 is made of a material having mechanical strength higher than that of the upper electrode 15. The thick pad electrode 20 is connected to the upper electrode 15 through the first barrier layer 20a with multiple openings. A top and whole side surfaces of the thick pad electrode 20 are covered with an aluminum film or an aluminum alloy film 20c through the second barrier layer 20b. The second barrier layer 20b prevents metallic reaction. The aluminum film or the aluminum alloy film 20c has excellent bonding property to the bonding wire 19. A part of the terminal protection resin film 18 is opened on an upper side of multiple impact-absorbing beams 16h so that the bonding wire 19 is connected to the thick pad electrode 20.

The preferable materials and constructions of the first barrier layer 20a, the thick pad electrode 20 and the second pad electrode 20b are similar to those of the second embodiment. Therefore, the detailed description thereof is skipped. Further, the preferable material and construction of the terminal protection resin film 18 is similar to the fourth embodiment, so that the detailed description thereof is skipped.

The function and effect of the semiconductor device D2 according to the present invention shown in FIG. 18 is similar to that of the second embodiment when the bonding connection is performed. Thus, the detailed description thereof is skipped. Further, the manufacturing method of the device D2 is similar to that of the second embodiment after the protection film 16 is formed. Thus, the detailed description thereof is skipped.

Sixth Embodiment

Figure 19:
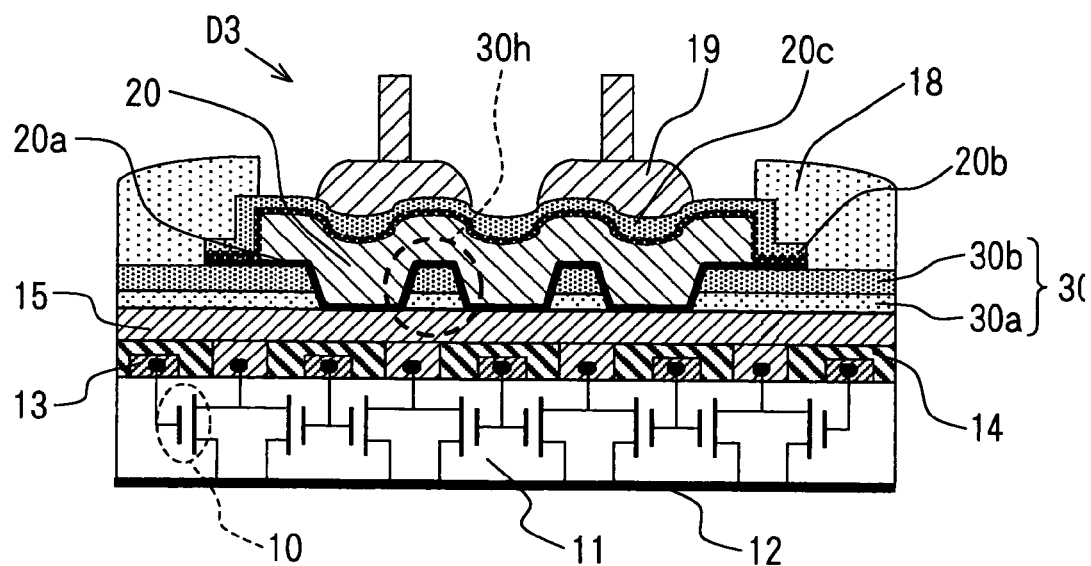
FIG. 19 is a schematic cross sectional view showing a semiconductor device according to a sixth embodiment of the present invention.

FIG. 19 schematically shows a semiconductor device D3 according to a sixth embodiment of the present invention.

The semiconductor device D3 shown in FIG. 19, similar to the semiconductor devices D1, D2 according to the fourth and fifth embodiments, is the semiconductor device having multiple unit cells 10 composing the vertical type device disposed in the silicon substrate 11. Here, in the semiconductor device D3, the construction disposed under the upper electrode 15 is similar to the semiconductor device D1 shown in FIG. 17. Therefore, the description thereof is skipped.

In the semiconductor device D3 shown in FIG. 19, a protection film 30 is formed on the upper electrode 15. The protection film 30 is, differently from that of the semiconductor devices D1, D2 shown in FIGS. 17 and 18, made of a binary-layered film composed of a lower protection film 30a and an upper protection film 30b. Similar to the third embodiment, preferably, the lower protection film 30a is made of dielectric material having high adhesiveness to the upper electrode 15, for example, a silicon oxide film. Preferably, the upper protection film 30b is made of dielectric material having high humidity-resistance, for example, a silicon nitride film. Further, multiple openings are adjacently disposed in the protection film 30 so that an impact-absorbing beam 30h is formed of the protection film 30 between the neighboring openings. Each opening has a tapered shape of a cross section.

In the semiconductor device D3 shown in FIG. 19, the thick pad electrode 20 is formed on the protection film 30. The thick pad electrode 20 connects to the upper electrode 15 through multiple openings. Similar to the semiconductor device D2 according to the fifth embodiment, the thick pad electrode 20 is made of a material having mechanical strength higher that that of the upper electrode 15. The thick pad electrode 20 is connected to the upper electrode 15 through the first barrier layer 20a. An aluminum film or an aluminum alloy film covers a top and whole side surfaces of the thick pad electrode 20 through the second barrier layer 20c. Here, the concavity attributed to the opening on the surface of the thick pad electrode 20 has a gradually tapered shape, compared with the tapered shape of the cross section of the opening. The taper angle of this surface concavity of the thick pad electrode 20 is preferably equal to or larger than 45 degrees, similar to the third embodiment.

In the semiconductor device D3 shown in FIG. 19, similar to the semiconductor device H4 shown in FIG. 11, the terminal protection resin film 18 for covering the thick pad electrode 20 is formed on the utmost top surface of the semiconductor substrate. A part of the terminal protection resin film 18 is opened, the part disposed on the upper side of multiple openings, so that the bonding wire 19 is connected to the thick pad electrode 20. Accordingly, the preferable materials and the constructions of the first barrier layer 20a, the thick pad electrode 20 and the second barrier layer 20b are similar to those of the semiconductor device H4 shown in FIG. 11. Thus, the detailed description thereof is skipped. Additionally, the preferable material and the construction of the terminal protection resin film 18 are similar to those described in the fourth embodiment. Thus, the detailed description thereof is skipped.

In the semiconductor device D3 shown in FIG. 19, the impact-absorbing beam 30h has a construction that the impact-absorbing beam 30h is packed between the upper electrode 15 and the thick pad electrode 20. Accordingly, the function and effect of the semiconductor device D3 are similar to those of the semiconductor device H4 shown in FIG. 11 when the bonding connection is performed. Thus, the detailed description thereof is skipped. Further, the manufacturing method of the device D3 is similar to that of the semiconductor device H4 shown in FIG. 11 after the upper electrode 15 is formed. Thus, the detailed description thereof is skipped, since one example of the manufacturing method of the semiconductor device D3 is similar to the manufacturing method shown in FIG. 12.

Seventh Embodiment

Figure 20:
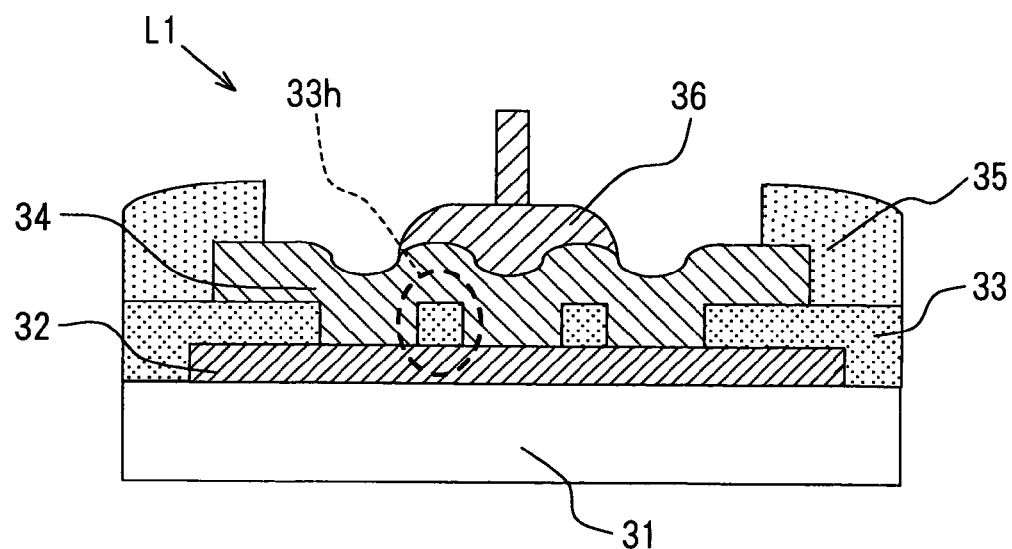
FIG. 20 is a schematic cross sectional view showing a semiconductor device according to a seventh embodiment of the present invention.

FIG. 20 schematically shows a semiconductor device L1 according to a seventh embodiment of the present invention.

In the semiconductor device L1 shown in FIG. 20, the protection film 33 covers the first pad electrode 32, which is formed on the semiconductor substrate 31. An integrated circuit is formed on the semiconductor substrate 31. Similar to the first embodiment and the fourth embodiment, multiple openings are adjacently disposed in the protection film 33. Further, the impact-absorbing beam 33h is formed of the protection film 33 between the neighboring openings.

Further, the second pad electrode 34 is formed on the protection film 33. The second pad electrode 34 is made of the same material as the first pad electrode 32, and connected to the first pad electrode 32 through multiple openings. Furthermore, the terminal protection resin film 35 for covering the second pad electrode 34 is formed on the utmost top surface of the semiconductor substrate 31. A part of the terminal protection resin film 35 is opened on an upper side of multiple impact-absorbing beams 33h so that the bonding wire 36 is connected to the second pad electrode 34.

The material of the first pad electrode 32 is preferably made of aluminum or aluminum alloy deposited by, for example, a sputtering method. The material of the protection film 16 is preferably made of a silicon nitride film deposited by, for example, a CVD method. The preferable constitution and construction of the impact-absorbing beam 16h are similar to those described in the first and the fourth embodiments. Thus, the detailed description thereof is skipped. It is preferred that the thickness of the second pad electrode 34 is sufficiently thick so that the bottom of the surface concavity on the second pad electrode 34 attributed to the opening is disposed on the upper side of the surface of the protection film 16. Further, the terminal protection resin film 18 is made of a poly-imide resin film, similar to the fourth embodiment. Preferably, the thickness of the terminal protection resin film 18 is thicker than the thickness of the second pad electrode 34.

The function and effect of the semiconductor device L1 according to the present invention shown in FIG. 20 are similar to those of the first and the fourth embodiments when the bonding connection is performed. Thus, the detailed description thereof is skipped. Further, the manufacturing method of the device L1 is similar to that of the first embodiment after the protection film 33 is formed. Thus, the detailed description thereof is skipped.

Eighth Embodiment

Figure 21:
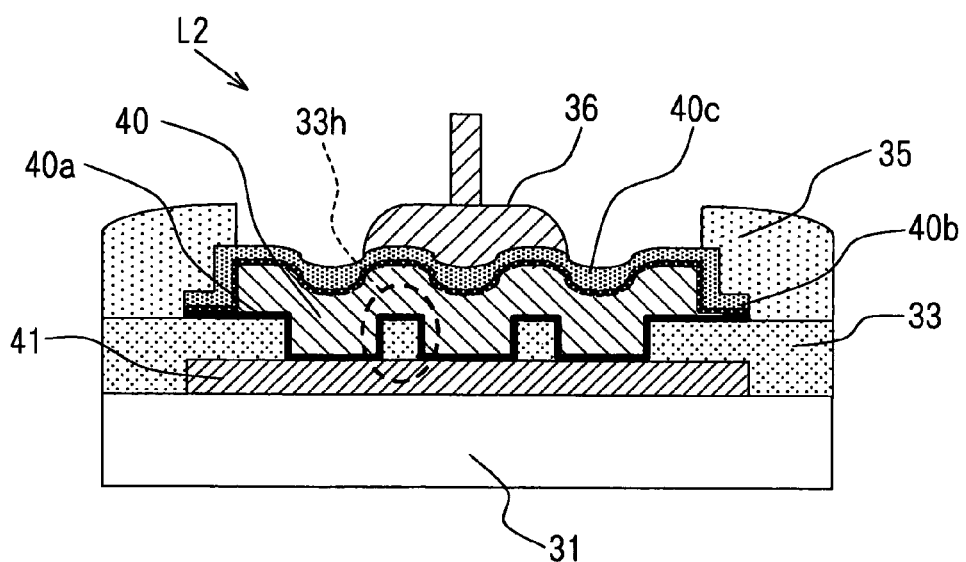
FIG. 21 is a schematic cross sectional view showing a semiconductor device according to an eighth embodiment of the present invention.

FIG. 21 schematically shows a semiconductor device L2 according to an eighth embodiment of the present invention.

In the semiconductor device L2 shown in FIG. 21, similar to the semiconductor device L1 according to the seventh embodiment, the protection film 33 covers the pad electrode 41. The pad electrode 41 is made of aluminum or aluminum alloy, and formed on the semiconductor substrate, on which an integrated circuit is formed. The impact-absorbing beam 33h is formed in the protection film 33.

On the other hand, in the semiconductor device L2 shown in FIG. 21, differently from the semiconductor device L1 shown in FIG. 20, but similar to the second and the fifth embodiments, the thick pad electrode 40 is formed on the protection film 33. The thick pad electrode 40 is made of a material having mechanical strength higher than that of the pad electrode 41, and connected to the pad electrode 41 through the first barrier layer 40a from multiple openings. Further, the top and whole side surfaces of the thick pad electrode 40 are covered with an aluminum film or an aluminum alloy film 40c through the second barrier layer 40b. The second barrier layer 40b prevents from metallic reaction. The aluminum film or the aluminum alloy film 40c has excellent connection property to the bonding wire 19. A part of the terminal protection resin film 35 is opened on the upper side of multiple impact-absorbing beams 33h so that the bonding wire 36 is connected to the thick pad electrode 40.

The preferable materials and the constructions of the first barrier layer 20a, the thick pad electrode 20, the second barrier layer 20b and the terminal protection resin film 18 are similar to those of the second and the fifth embodiments. Thus, the detailed description thereof is skipped.

The function and effect of the semiconductor device D2 according to the present invention shown in FIG. 20 are similar to those of the second and the fifth embodiment 11 when the bonding connection is performed. Thus, the detailed description thereof is skipped. Further, the manufacturing method of the device D2 is similar to that of the second and the fifth embodiments after the protection film 33 is formed. Thus, the detailed description thereof is skipped.

Ninth Embodiment

Figure 22:
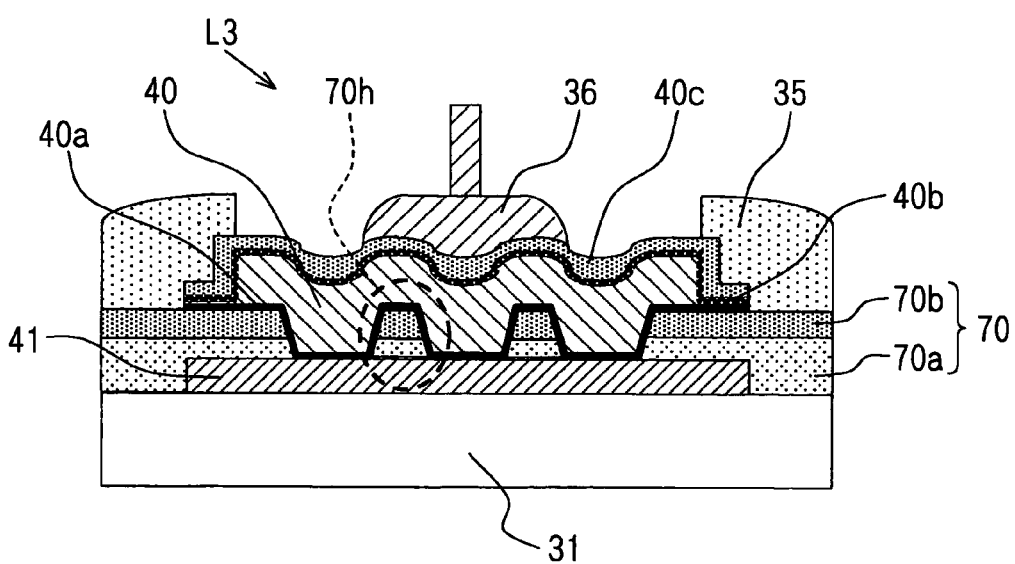
FIG. 22 is a schematic cross sectional view showing a semiconductor device according to a ninth embodiment of the present invention.

FIG. 22 schematically shows a semiconductor device L3 according to a ninth embodiment of the present invention.

In the semiconductor device L3 shown in FIG. 22, similar to the semiconductor devices L1, L2 according to the seventh and the eighth embodiments, the pad electrode 41 is covered with the protection film 70. The pad electrode 41 is made of aluminum or aluminum alloy, and formed on the semiconductor substrate 31, on which an integrated circuit is formed.

On the other hand, in the semiconductor device L3 shown in FIG. 22, differently from the semiconductor devices L1, L2 according to the seventh and the eighth embodiments, the protection film 70 is formed of a binary-layered film composed of the lower protection film 70a and the upper protection film 70b. Similar to the third embodiment, the lower protection film 70a is preferably made of dielectric material having high adhesiveness to the pad electrode 41, for example, a silicon oxide film. The upper protection film 70b is preferably made of dielectric material having high humidity resistance, for example, a silicon nitride film. Further, multiple openings having a tapered shape cross section are adjacently disposed in the protection film 70, so that the impact-absorbing beam 70h is formed of the protection film 70 between the neighboring openings.

In the semiconductor device L3 shown in FIG. 22, the thick pad electrode 40 is formed on the protection film 70. The thick pad electrode 40 is connected to the pad electrode 41 through multiple openings. Similar to the semiconductor device D2 according to the fifth embodiment, the thick pad electrode 40 is made of material having mechanical strength higher than that of the pad electrode 41. The thick pad electrode 40 is connected to the pad electrode 41 through the first barrier layer 40a. The top and whole side surfaces of the thick pad electrode 40 are covered with an aluminum film or an aluminum alloy film through the second barrier layer 40c. Here, the concavity attributed to the opening on the surface of the thick pad electrode 40 has a gradually tapered shape, compared with the tapered shape of the cross section of the opening. Preferably, the taper angle of the surface concavity of the thick pad electrode 40 is equal to or larger than 45 degrees, similar to the third and the fifth embodiments.

In the semiconductor device L3 shown in FIG. 22, similar to the semiconductor device H4 shown in FIG. 11 and the semiconductor device D3 shown in FIG. 19, the terminal protection resin film 35 for covering the thick pad electrode 40 is formed on the utmost top surface of the semiconductor substrate. A part of the terminal protection resin film 35 on the upper side of multiple impact-absorbing beams 70h is opened so that the bonding wire 36 is connected to the thick pad electrode 40. Accordingly, the preferable materials and constructions of the first barrier layer 40a, the thick pad electrode 40, the second barrier layer 40b and the terminal protection resin film 35 are similar to those of the semiconductor device H4 shown in FIG. 11 and the semiconductor device D3 shown in FIG. 19. Thus, the detailed description thereof is skipped.

The semiconductor device L3 shown in FIG. 22 has a construction that the impact-absorbing beam 70h is packed between the pad electrode 41 and the thick pad electrode 40. Accordingly, the function and effect of the semiconductor device L3 are similar to those of the semiconductor device H4 shown in FIG. 11 and the semiconductor device D3 shown in FIG. 19 when the bonding connection is performed. Thus, the detailed description thereof is skipped. Further, the manufacturing method of the device L3 is similar to that of the semiconductor device H4 shown in FIG. 11 after the upper electrode 15 is formed. Thus, the detailed description thereof is skipped, since the manufacturing method of the semiconductor device D3 is similar to the manufacturing method shown in FIG. 12.

Figure 23A:
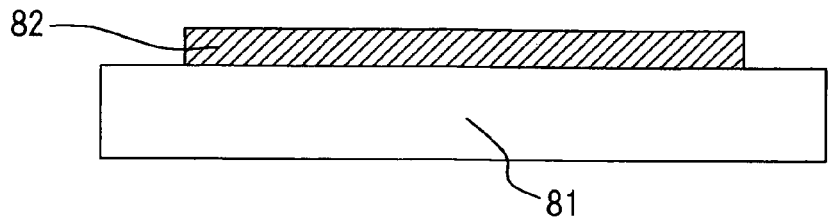
FIGS. 23A to 23D are cross sectional views showing each step in the manufacturing method of the semiconductor device according to the ninth embodiment.
Figure 23B:
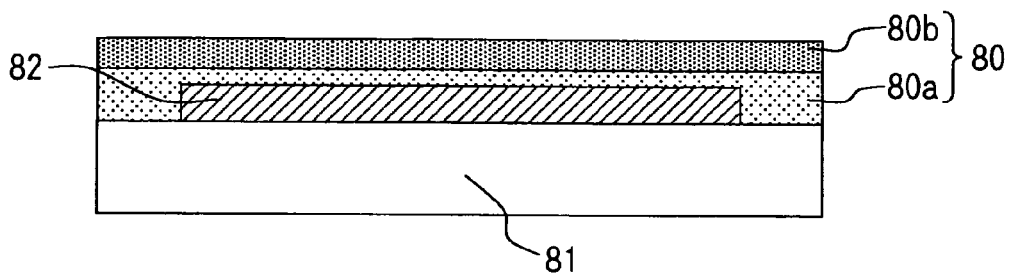
Figure 23C:
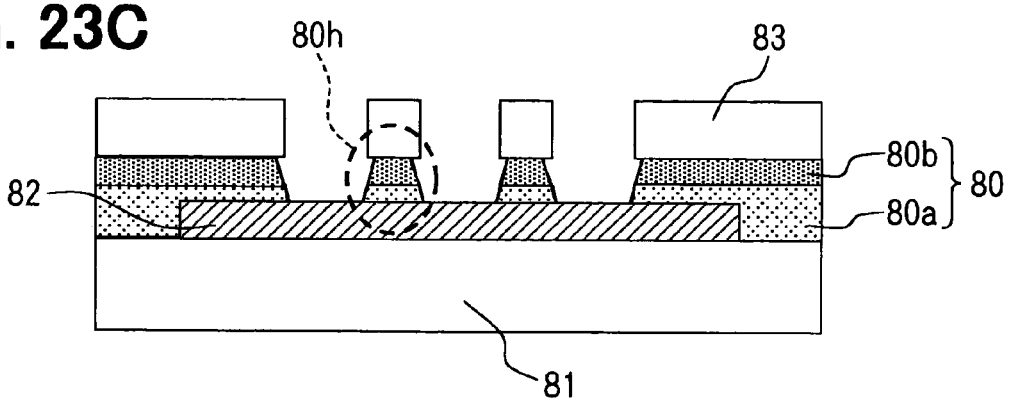
Figure 23D:
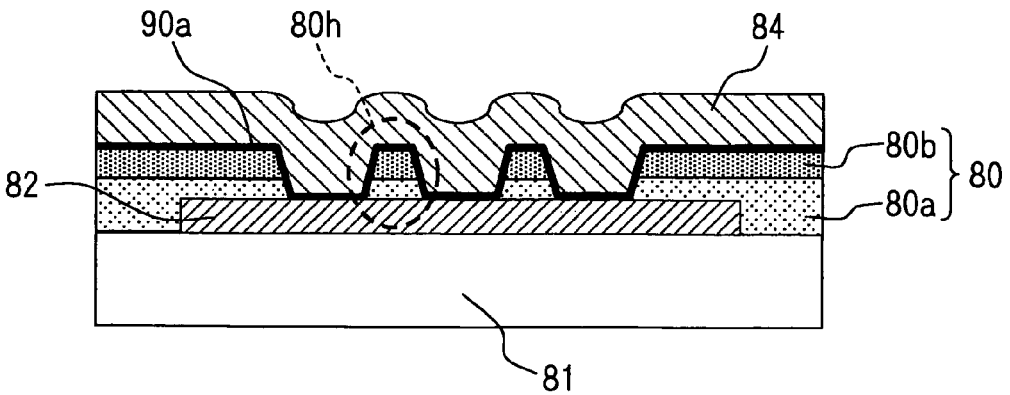
Figure 24A:
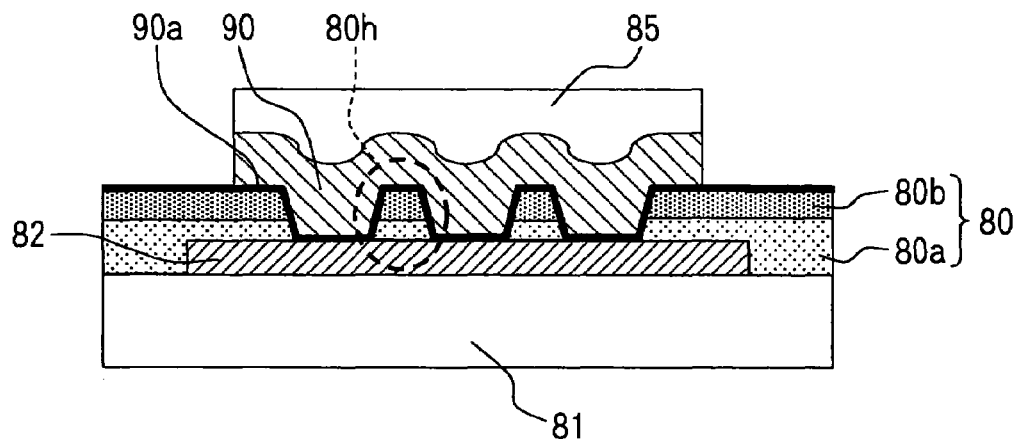
FIGS. 24A to 24C are cross sectional views showing each step in the manufacturing method of the semiconductor device according to the ninth embodiment.
Figure 24B:
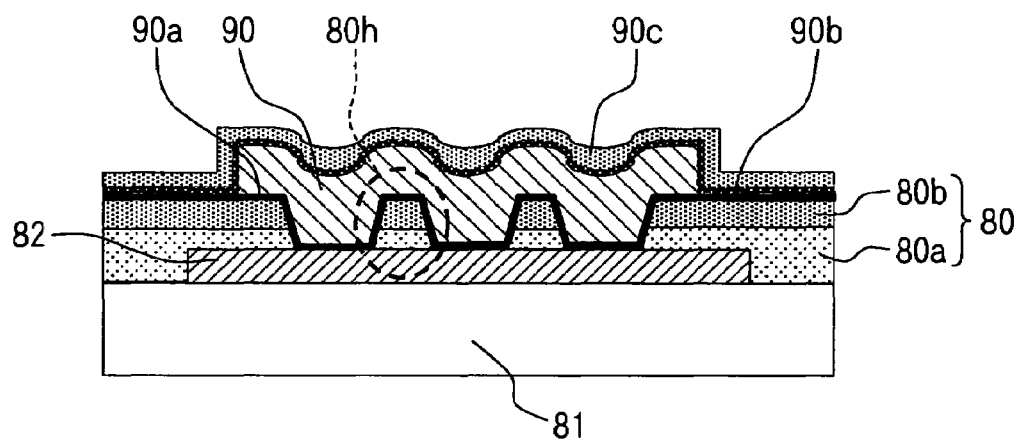
Figure 24C:
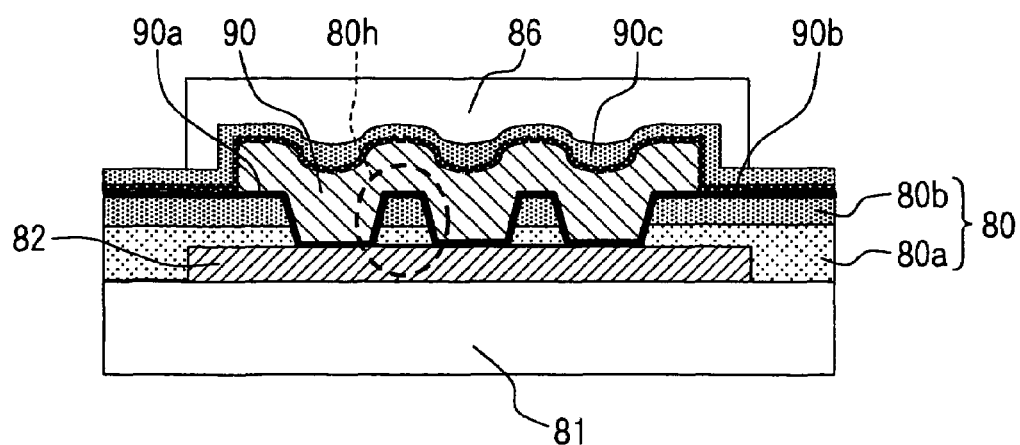
Figure 25A:
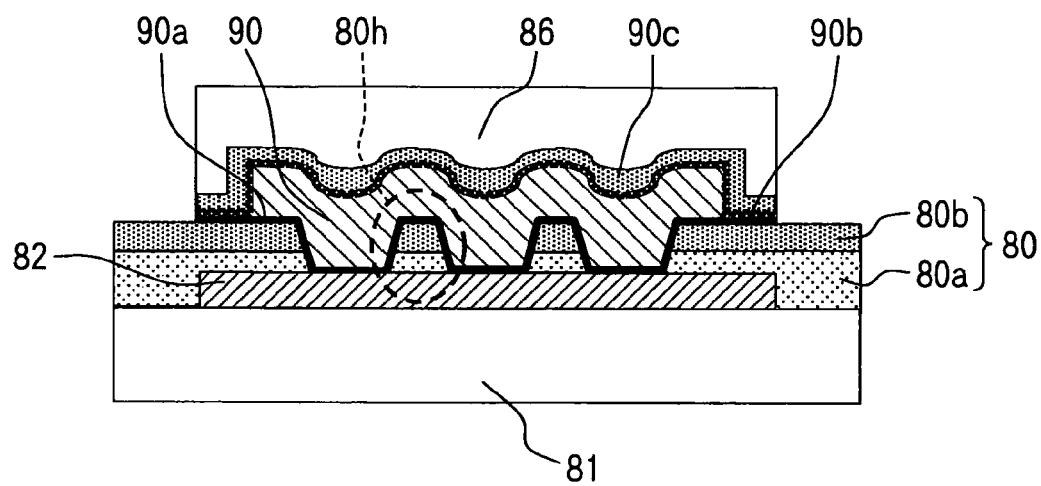
FIGS. 25A and 25B are cross sectional views showing each step in the manufacturing method of the semiconductor device according to the ninth embodiment.
Figure 25B:
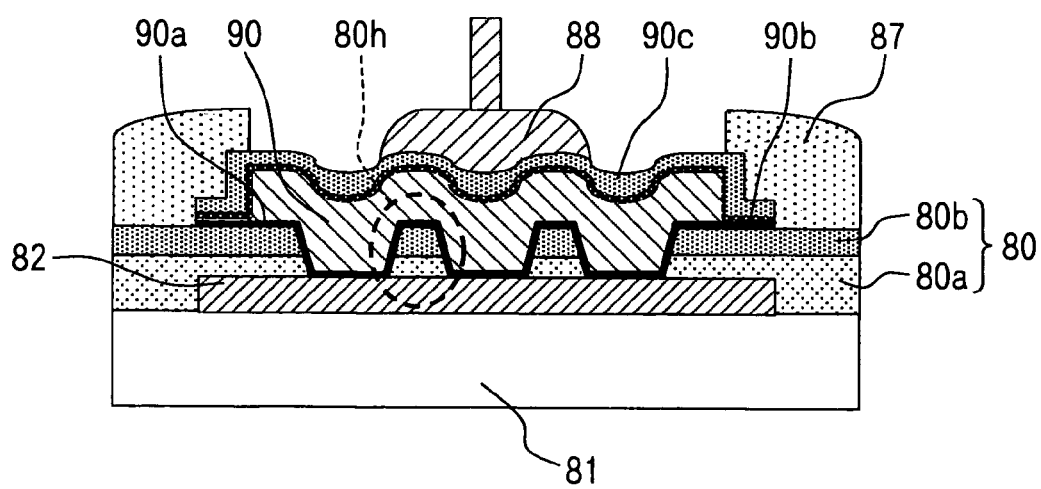

Another manufacturing method of the semiconductor device H4 according to the present invention shown in FIG. 11, the semiconductor device D3 shown in FIG. 19, and the semiconductor device L3 shown in FIG. 22 is shown in FIGS. 23 to 25 as an example of the semiconductor device L3.

As shown in FIG. 23(a), a pad electrode 82 made of aluminum or aluminum alloy and an integrated circuit are formed on a semiconductor substrate 81. As shown in FIG. 23(b), a lower protection film 80a and an upper protection film 82c as a protection film 80 for protecting the semiconductor substrate 81 are formed on the substrate 81 in this order by, for example, a CVD method. The lower protection film 80a is made of, for example, a silicon oxide film having high adhesiveness to the pad electrode 82. The upper protection film 82c is made of a silicon nitride film.

After that, as shown in FIG. 23(c), multiple openings are formed in the protection film 80 by using a mask 83. Thus, an impact-absorbing beam 80h is formed of the protection film 80 between the neighboring openings. At this time, it is preferred that the impact-absorbing beam 50h is processed so that the cross section of the impact-absorbing beam 50h becomes a tapered shape.

Next, as shown in FIG. 23(d), the first barrier layer 90a and a thick metallic film 84 are formed in vacuum successively by, for example, a sputtering method. They are formed on the surface of the semiconductor substrate 81, on which the impact-absorbing beam 80h is formed. At this time, the first barrier layer 90a is a film for preventing metallic reaction between the pad electrode 82 and the thick metallic film 85. The material of the first barrier layer 90a is, preferably, titanium, titanium nitride, titanium-tungsten, or a stacked film composing them.

Further, the thick metallic film 84 is preferably made of a material having a low specific resistance lower than the pad electrode 82 and having mechanical strength higher than the pad electrode 82. More preferably, the material of the thick metallic film 84 is, for example, copper. In addition, to pack the impact-absorbing beam 80h, it is preferred that the thick metallic film 84 is formed by a deposition method under a deposition condition having high step coverage. The thickness of the thick metallic film 84 is set to be a predetermined thickness in such a manner that the bottom of the concavity on the surface of the thick metallic film 84 attributed to the opening is disposed on an upper side of the surface of the impact-absorbing beam 50h in order to cover the impact-absorbing beam 50h.

Next, as shown in FIG. 24(*a*), only excess part of the thick metallic film 84 is removed by a wet etching process having selectivity over the first barrier layer 90a with using the mask 85 processed to have a predetermined pattern. Thus, the thick pad electrode 90 covering multiple impact-absorbing beams 50h completely is formed.

After that, as shown in FIG. 24(*b*), the second barrier layer 90b and the aluminum film or the aluminum alloy film 90c are formed in vacuum successively on the surface of the semiconductor substrate 81 by, for example, a sputtering method so that the top and whole side surfaces of the thick pad electrode 90 are completely covered. At this time, the material of the second barrier layer 90b is preferably titanium, titanium nitride, titanium-tungsten, or a stack film composing them. Further, it is preferred that the second barrier layer 90b is made of the same material as the first barrier layer 901a, and has the same construction as the first barrier layer 90a.

Further, as shown in FIG. 24(*c*), the mask 86 processed to have a predetermined pattern is formed for covering the thick pad electrode 90 completely. Here, the mask 86 has a plane size larger than a plane size of the thick pad electrode 90 so that both plane shapes of the second barrier layer 90b for covering the thick pad electrode 90 and the aluminum film or the aluminum alloy film 90c contains the plane shape of the thick pad electrode 90 into them.

Next, as shown in FIG. 25(*a*), excess portions of the aluminum film or the aluminum alloy film 90c, the second barrier layer 90b and the first barrier layer 90a are successively etched and removed by using the mask 86. Preferably, this etching process is performed by a wet etching process so that the semiconductor substrate 81 having the integrated circuit disposed under them is not damaged.

Then, as shown in FIG. 25(*b*), the terminal protection resin film 87 is formed to have sufficient thickness for covering and protecting the thick pad electrode 90, for example, to have the thickness thicker than that of the thick pad electrode 90. A part of the terminal protection resin film 87 disposed on the upper side of the impact-absorbing beam 80h is opened so that the thick pad electrode 90 is bonded. The material of the terminal protection resin film 87 is preferably formed of a poly-imide resin film so that no crack or the like is generated in the resin film 87 even when sufficient thick resin film 87 is formed.

At last, the boding wire 88 is bonded to the thick pad electrode 90 through the aluminum film or the aluminum alloy film 90c and the second barrier layer 90b by using a supersonic bonding method. The thick pad electrode 90 is exposed from the opening of the terminal protection resin film 87.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device having a construction comprising:
   a plurality of power MOS cells disposed on a semiconductor substrate;
   a plurality of lead wires connecting to a source and a drain of each power MOS cell through a contact hole for retrieving electric potential of each of the source and the drain;
   a plurality of collecting electrodes connecting in parallel with the lead wires of each of the source and the drain through a via hole for collecting electric potentials;
   an interlayer protection film formed on the collecting electrode of each of the source and the drain, wherein a plurality of openings is formed in the interlayer protection film in such a manner that a portion between the openings becomes a beam shape;
   a thick film electrode connecting to the collecting electrode of each of the source and the drain through a first barrier layer in the opening and made of material having a mechanical strength higher than that of a material composing the collecting electrode, wherein a top and whole side surfaces of the thick film electrode are covered with an aluminum film or an aluminum alloy film through a second barrier layer; and
   a terminal protection film for covering the thick film electrode and having an opening for a bonding connection.

2. The semiconductor device according to claim 1, wherein a plurality of openings formed in the interlayer protection film has a planar construction such that a corner of the opening is rounded or chamfered.

3. The semiconductor device according to claim 1, wherein a plurality of openings formed in the interlayer protection film has a shape such that one side of the opening is longer than the other side of the opening, and
   the longer side of the opening is perpendicular to a vibration direction of a supersonic vibration in a case where the bonding connection is performed.

4. The semiconductor device according to claim 1, wherein a film thickness of the thick film electrode formed on the interlayer protection film having a plurality of the openings is sufficiently thick so that a bottom of a concavity on a surface attributed to the opening is disposed on an upper side of a surface of the interlayer protection film.

5. The semiconductor device according to claim 1, wherein a material of the collecting electrode is aluminum or aluminum alloy.

6. The semiconductor device according to claim 1, wherein the first barrier layer is made of titanium, titanium nitride, titanium-tungsten or a stacked film thereof.

7. The semiconductor device according to claim 1, wherein a material of the thick film electrode is copper.

8. The semiconductor device according to claim 1, wherein the second barrier layer is made of titanium, titanium nitride, titanium-tungsten or a stacked film thereof.

9. The semiconductor device according to claim 1, wherein the terminal protection film is a poly-imide resin film, and a thickness of the terminal protection film is thicker than the thickness of the thick film electrode.

* * * * *